United States Patent [19]

Meise et al.

[11] Patent Number: 4,843,358
[45] Date of Patent: Jun. 27, 1989

[54] ELECTRICALLY POSITIONABLE SHORT-CIRCUITS

[75] Inventors: William H. Meise, Wrightstown, Pa.; Arye Rosen, Cherry Hill, N.J.; Paul J. Stabile, Langhorne, Pa.

[73] Assignee: General Electric Company, Princeton, N.J.

[21] Appl. No.: 211,102

[22] Filed: Jun. 20, 1988

Related U.S. Application Data

[63] Continuation of Ser. No. 51,423, May 19, 1987, abandoned.

[51] Int. Cl.$^4$ ............................................. H01P 1/00
[52] U.S. Cl. .................................... 333/263; 333/103; 333/247; 333/262; 307/259
[58] Field of Search ............... 333/263, 247, 262, 253, 333/258, 220, 221, 103, 104, 101; 357/51, 58; 307/259, 146, 318, 317 R, 317 A, 319

[56] References Cited

U.S. PATENT DOCUMENTS

| | | | |
|---|---|---|---|
| 3,309,610 | 3/1967 | Yamamoto | 307/318 X |
| 3,491,314 | 1/1970 | White | 333/263 X |
| 3,492,514 | 1/1970 | Korn | 307/320 |
| 3,527,985 | 9/1970 | Brown | 307/318 X |
| 3,875,535 | 4/1975 | Chang | 307/317 X |
| 3,959,750 | 5/1976 | Holt | 333/262 |
| 4,096,453 | 6/1978 | Rogers | 333/221 X |
| 4,216,450 | 8/1980 | Linke et al. | 333/263 X |
| 4,267,538 | 5/1981 | Assal et al. | 333/262 |
| 4,402,089 | 8/1983 | Knight et al. | 455/186 |
| 4,408,348 | 10/1983 | Theriault | 455/180 |
| 4,418,427 | 11/1983 | Muterspaugh | 455/180 |
| 4,494,081 | 1/1985 | Lea et al. | 331/36 C |
| 4,630,011 | 12/1986 | Neidert et al. | 333/164 |
| 4,697,160 | 9/1987 | Clark | 333/104 X |

OTHER PUBLICATIONS

Fleming et al., "GaAs SAMP Device for Ku-Band Switching", conference: 1979 IEEE MTT-S International Microwave Symposium Digest, May 2, 1979, pp. 253-255.

Hart, "Diode Model of the M.O.S.F.E.T.," *Wireless World*, Apr. 1976, pp. 77-79.

Sze, "Physics of Semiconductor Devices," 2nd Edition, published by John Wiley and Sons, New York, 1981.

Carr, "Measuring Standing-Wave Ratio", Electronic Servicing, Dec. 1979, pp. 31-38.

Chenkin, "Bias Tee Combines DC and RF Signals Across Ka-Band", Microwaves & RF, Oct. 1988, pp. 93-97.

*Primary Examiner*—Eugene R. LaRoche
*Assistant Examiner*—Seung Ham
*Attorney, Agent, or Firm*—Clement A. Berard, Jr.

[57] ABSTRACT

An electrical short-circuit for alternating-current (ac) microwave signals is physically positionable in direct response to an electrical bias control without an intermediary electromechanical converter. The electrically positionable short circuit includes at least first and second doped regions in a semiconductor, separated by a region in which the short circuit is formed between the doped regions by the bias. A first embodiment comprises discrete diodes connected between conductors at different locations, the discrete diodes having different forward junction voltages, so that varying the common bias voltage varies the number of conducting diodes and thus positions the short circuit in a stepwise manner. A FET embodiment includes various discrete MOSFETs having different conduction threshold voltages, and having their sources and drains connected at various points to the conductors to be short-circuited, so that variations of a common gate bias voltage selectively render one or more of the FETs conductive, thereby stepwise positioning the short-circuit. Distributed PIN and MOSFET structures provide continuous short circuit positioning as a monotonic function of bias. Two distinct modes of operation, pinchoff/resistive and a resistive/below-threshold are possible for the distributed FET embodiment. The electrically positionable short-circuit can be coupled to the conductors of a transmission line for effecting tuning, or can be coupled to a transmission line in such a way as to vary the signal path length and thereby provide phase shift.

17 Claims, 16 Drawing Sheets

ELECTRICALLY POSITIONABLE SHORT-CIRCUITS

This is a continuation of application Ser. No. 051,423, filed May 19, 1987 now abandoned.

This invention relates to electrically positionable or movable short-circuits which are controlled to tune or adjust microwave circuits.

BACKGROUND OF THE INVENTION

Microwave (3 to 30 GHz) and millimeter-wave (30 to 300 GHz) circuits are widely used for high data rate communications; for sensing and ranging applications, and the like. It is common in microwave (and millimeter-wave, hereinafter called microwave) circuits to perform tuning to limit bandwidth and to optimize performance. A common type of tuning element is a mechanical stub tuner or a double-stub tuner, which consists of one or two branch or "stub" transmission lines in parallel with a through transmission line such as a coaxial transmission line. Short-circuits coupled to the stub transmission lines are adjusted closer to or farther from their junction to the through transmission line for impedance matching. Similarly, a portion of a transmission line similar to a resonant cavity can be tuned by a sliding short-circuit or plunger to provide a bandpass characteristic or to define the frequency of an oscillator.

It is often desirable to remotely control the operating frequency of a microwave system. This has been accomplished in the past by the use of mechanical short circuits remotely operated by a motor such as a solenoid actuator, selsyn (synchro) or the like. However, motor-driven short circuits in addition to the problems of intermittent wiper contacts associated with any mechanical sliding short circuit also have reliability problems relating to the motors and motor drives. For this reason, electronic tuning has become popular. Electronic tuning is accomplished by means of electrically variable elements.

A saturable reactor is an inductor with a magnetic core which affects the inductance. A bias current flowing through the core may drive the core into a region in which it is partially saturated, thereby changing the incremental inductance of the reactor. Saturable reactors tend to require a substantial number of ampere-turns for the bias current, and therefore tend to be relatively large and unsuited for high frequencies. Electronic tuning may also be accomplished by the sue of varicaps or varactor diodes coupled to the circuit to be tuned. A bias voltage is applied to the varicap diode to control its capacitance and thereby tune the resonant circuit. The use of the varicap diode, however, requires that the remainder of the circuit to be tuned have an inductive characteristic so that resonance can be achieved.

Antennas are tuned in two distinct fashions. The first and more basic manner is to change the physical dimensions of the structure, as by making dipole elements physically longer to tune from a higher frequency to a lower frequency. This is done, for example, in the common "rabbit-ear" television set-top antenna. This type of tuning maintains constant aperture in relation to the wavelength, and results in maintaining the same input impedance at the antenna feed terminals, and also results in maintaining the same radiation pattern, and therefore the same directive gain, at all frequencies. The second type of tuning associated with antennas involves varying the reactance as a function of frequency of a variable reactance element which is coupled to the antenna. For example, a dipole element has an input impedance which includes a series equivalent capacitive reactance, the magnitude of which increases with decreasing frequency. This might be "tuned" in the second manner with a variable series inductor, the reactance of which is selected to cancel the antenna capacitive reactance. This second type of tuning, however, allows the input impedance of the antenna to change with frequency (the remaining radiation resistance decreases with decreasing frequency), and the current distribution on the antenna also changes with frequency, resulting in changes in the radiation pattern and therefore in the directive gain.

It would be desirable to have the ability to move the physical position of a short circuit directly by electrical means without the intervention of an electromechanical converter such as a motor or a solenoid-actuated plunger.

SUMMARY OF THE INVENTION

An electrically positionable short circuit includes first and second conductors adapted for receiving alternating currents. A semiconductor arrangement is physically located and extended between the first and second conductors at a plurality of distinct locations along each of the first and second conductors. This arrangement is adapted to receive a bias and to respond to the magnitude of the bias in a manner which, at a first bias magnitude, presents low impedance path between first physically distinct locations high impedance path between second physically distant locations. At a second bias magnitude greater than the first boas magnitude, a low impedance path is generated between the second physically distinct locations on the first and second conductors.

DESCRIPTION OF THE DRAWING

FIG. 5b is a cut away perspective view of a semiconductor arrangement for implementing the arrangement of FIG. a;

DETAILED DESCRIPTION OF THE INVENTION

Figure 1:
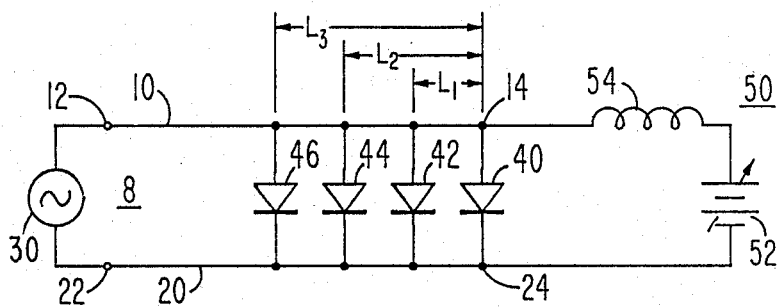
FIG. 1 is a schematic diagram pictorial illustration of a first embodiment of the invention utilizing discrete diodes.

FIG. 1 illustrates a pair of elongated parallel conductors 10 and 20 forming a transmission line designated generally as 8. Conductor 10 extends from a terminal 12 to a terminal 14. Conductor 20 extends parallel to conductor 10 between terminals 22 and 24. A generator or other circuit illustrated as 30 is connected between terminals 12 and 22 for applying alternating current signal to terminals 12 and 22. A junction diode 40 has its anode connected to terminal 14 and its cathode connected to terminal 24. At a distance $L_1$ from terminals 14 and 24, a further diode 42 has its anode connected to conductor 10 and its cathode connected to conductor 20. At a further location separated from terminals 14 and 24 by a distance $L_2$ along transmission line 8 formed by parallel conductors 10 and 20, a further diode 44 has its anode connected to conductor 10 and its cathode connected to conductor 20. A fourth diode 46 is similarly connected to conductors 10 and 20 of transmission line at a distance $L_3$ greater than distance $L_1$ and $L_2$ from terminals 14 and 24. Diodes 40, 42, 44 and 46 have forward junction voltages or offset voltages which progressively increase with distance from terminals 14 and 24. For example, diode 40 may have the lowest junction voltage, as for example 0.25 volts. Diode 42 has a somewhat greater forward voltage, as for example 0.3 volts. Diode 44 has a yet larger forward junction voltage, as for example 0.65 volts, and diode 46 has a still larger junction voltage, as for example 0.7 volts.

Such different forward junction voltages arise, for example, if diode 40 is a Schottky or hot-carrier diode, diode 42 is a germanium diode, diode 44 is a gallium arsenide diode and diode 46 is a silicon diode.

A bias source designated generally as 50 includes a source of bias voltage illustrated as a variable battery 52 coupled by a high impedance illustrated as a choke 54 to terminals 14 and 24. As the voltage produced by battery 52 is varied, one or more of the diodes 40, 42, 44 and 46 may be rendered conductive. When a diode is rendered conductive, a short circuit is effectively produced for the alternating current (ac) signals propagating away from terminals 12 and 22 between and along conductors 10 and 20 of transmission line 8. This will be true so long as the magnitude of the ac signal is less than the magnitude of the bias. Alternating current or microwave signals applied to terminals 12 and 22 propagate along transmission line 8 formed by conductors 10 and 20 until they reach a conductive diode. At that point, the signals are reflected (with a phase inversion) as known in the art and interact with the incident signals to produce a system of standing waves. Under certain conditions, the transmission line including conductors 10 and 20 and the short circuit produced by one or more of diodes 40–46 extending therebetween may be viewed as a resonator. More particularly, a high impedance will appear between terminals 12 and 22 for microwave signals applied from source 30 when the electrical distance between 12 and 22 and a conductive diode is one-quarter wavelength. For example, if diodes 40, 42 and 44 are conductive and diode 46 is nonconductive, the arrangement illusrtated in FIG. 1 will be resonant (present the highest or lowest impedance at terminals 12 and 22) when the distance of terminals 12 and 22 from the nearest conductive diode (diode 44) is one quarter wavelength (or an integer multiple of quarter wavelengths). It is clear that by controlling the voltage produced by bias source 52, the actual position of a short circuit between conductors 10 and 20 can be moved closer to or farther from terminals 12 and 22.

It is important to note that, to a first approximation, the only diode which affects the tuning of transmission line 8 is that conductive diode which is closest to the feed terminals 12 and 22. The fact that other diodes conduct may be relevant in a secondary fashion, as for example by providing parallel paths for the flow of a small portion of the ac (alternating current) signal current, attributable to the finite dynamic or incremental resistance of the closest conducting diode.

Figure 2A:
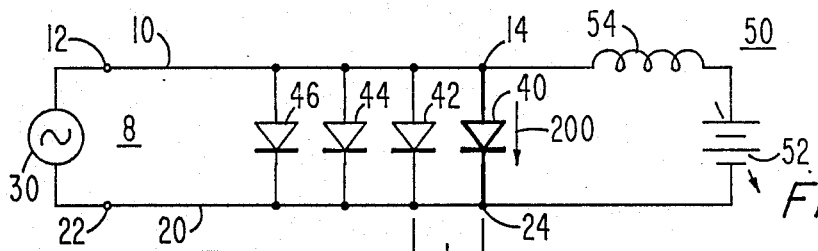
FIGS. 2a, 2b and 2c illustrate the effects of selection of different bias values on the arrangement of FIG. 1.
Figure 2B:
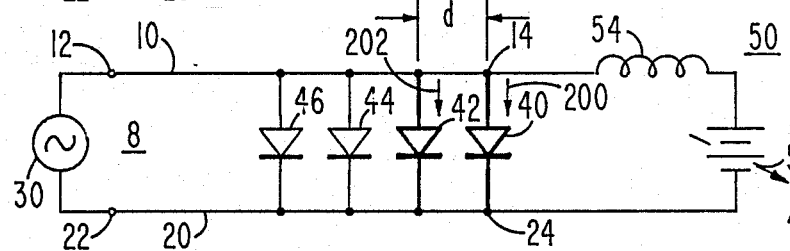
Figure 2C:
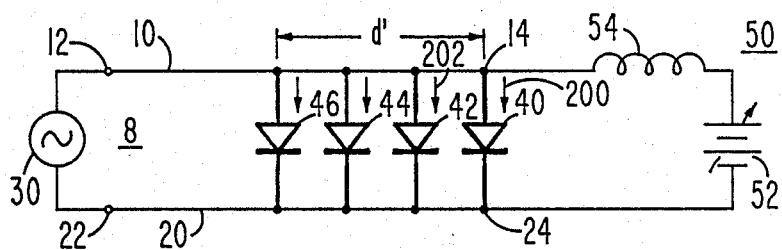

FIGS. 2a, 2b and 2c illustrate the conditions which occur when the bias voltage is varied. In FIGS. 2a, 2b and 2c, elements corresponding to those in FIG. 1 are designated by the same reference numberal. In FIG. 2a, the arrow accociated with battery 52 is in a position, representing a relatively low bias voltage of about 0.25 volts, sufficient to forward-bias diode 40 into conduction, thereby causing a bias current to flow, as represented by an arrow 200 adjacent to diode 40, which reduces the dynamic (ac) impedance between terminals 14 and 24, as known. The dynamic impedance varies with diode current in a known manner. In particular, for an ordinary semiconductor junction diode, the dynamic impedance $R_d$ (neglecting junction capacitance) is given by $$R_d = \frac{kT}{qI} \tag{1}$$

where
- k=Boltzmann's constant, 1.38 ($10^{-16}$) erg/°K;
- T=absolute temperature, °K;
- q=charge of an electron, 1.6 ($10^{-19}$) coulomb; and
- I=diode forward current in milliamperes (mA)

The value of kT/q at room temperature is 26 millivolts (mV), so at a diode current of one mA, $R_d$ has a value of 26 ohms.

Coaxial transmission lines (coax) are the prototypes for various transmission lines which are topological transformations of coax, such as microstrip and stripline. It is known that lowest attenuation per unit length in a coaxial transmission line occurs at a characteristic impedance of about 70 ohms, and highest power-handling capability occurs at about 50 ohms. Consequently, characteristic impedances on this order of magnitude are very common, although for special applications other impedances are sometimes used. The same order of magnitude apples to the topological transform transmission lines.

In order to short-circuit a source or transmission line, it is necessary for the short-circuiting path to have an impedance which is sufficiently lower than that of the source so that the source or transmission line impedance is the dominating factor in establishing the current. A generally accepted rule-of thumb value in this regard is a ratio of 10:1. That is, one impedance may be considered insignificant relative to another when it is 10 times larger (for a parallel combination) or 10 times smaller (for a series combination). In the context of a transmission line, a short-circuit with an impedance ratio of 10:1 gives a VSWR of 10.

In order for a junction diode to have a dynamic impedance on the order of 10% of that of an ordinary coax or microstrip transmission line, it must have an impedance of about 5 ohms. From equation (1), this situation occurs at a diode bias current of about 5mA. Thus, at a few milliamperes of bias current the diode impedance will be so much less than the characteristic impedance of transmission line 8 that diode 40 for all practical purposes acts as a short-circuit with respect to the ac signal. As mentioned, choke 54 prevents any residual ac signal appearing across diode 40 from being coupled to battery 52. The short-circuit condition presented by diode 40 to transmission line 8 is represented by the heavy lines connecting diode 40 to conductors 10 and 20.

Figure 3:
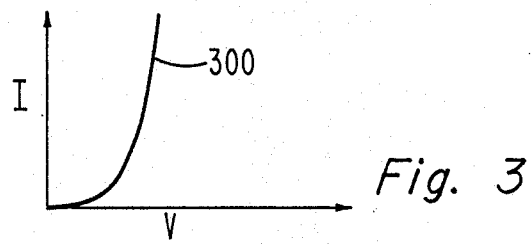
FIG. 3 is a plot of the bias current versus bias voltage characteristic of the arrangements of FIGS. 1, 5a, 5b.

FIG. 2b represents, by the counterclockwise (CCW) rotation of the arrow associated with battery 52 a condition in which the bias voltage produced by battery 52 is sufficiently greater than that of FIG. 2a to render diode 42 conductive. As the bias voltage is increased from that illustrated in FIG. 2a to that illustrated in FIG. 2b, bias current flows in diode 42 as represented by arrow 202, and bias current 200 through diode 40 will tend to increase exponentially. However, as long as bias supply 50 can produce the desired combination of current and voltage, the dynamic impedance of diode 40 is further reduced, and the resulting short circuit is more perfect. FIG. 3 illustrates the exponential form of the bias current as a function of bias voltage in diode 40 and more generally in the whole of the arrangement of FIG. 1. The dynamic impedance of diode 40 was already low, however, when compared with the characteristic impedance of transmission line 8. Consequently, the additional bias voltage does not markedly affect the short-circuiting effect of diode 40. Diode 42, on the other hand, was nonconductive (high impedance) at a bias level corresponding to that illustrated in FIG. 2a, and takes on a low impedance under the bias conditions of FIG. 2b. Consequently, its dynamic impedance causes a significant change from a condition much greater than the characteristic impedance of transmission line 8 to a condition of much lower impedance. The dynamic impedance of diode 42 in FIG. 2b is eqivalent to a short circuit, and is represented by heavy lines connecting diode 42 to conductors 10 and 12. Considering that the additional conductive diodes, (those more remote from terminals 12 and 22 than the nearest conducting diode) are of secondary importance, it can be seen that when the bias voltage was increased in going from the FIG. 2a configuration to the FIG. 2b configuration, the ac short-circuit effectively moved to the left, thus moving one step closer to ac signal input terminals 12 and 22. As mentioned, this effectively increases the resonant frequency of transmission line 8.

FIG. 2c represents by a further counterclockwise rotation of the arrow associated with battery 52 a condition of greater bias voltage than that of FIG. 2b. The bias voltage produced by battery 52 in FIG. 2b is sufficient to forward-bias all four diodes 40-46, thereby causing bias current to flow as represented by arrows, and giving all the diodes a relatively low dynamic impedance, as represented by heavy lines. It is clear that the effective position of the short-circuit between conductors 10 and 12 has moved by another step, even closer to input terminals 12 and 22. This bias condition represents the closest approach of the effective short-circuit to terminals 12 and 22, and also represents the highest resonant frequency of transmission line 8.

It should be noted that bias source 50 may be connected across conductors 10 and 20 of transmission line 8 at any point along the length of transmission line 8. The location of the connections at terminals 14 and 24 as illustrated in FIG. 1 is particularly advantageous because this location, during operation, carries the heaviest bias current flow and therefore has the lowest dynamic impedance of any point along transmission line 8.

Figure 4:
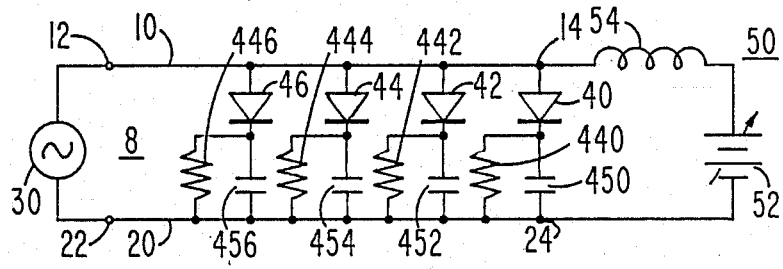
FIG. 4 is a schematic diagram of another embodiment of the invention using discrete diodes and resistors for reducing the peak bias current.

FIG. 4 illustrates a circuit arrangement which reduces the maximum current drain on bias supply 50. In FIG. 4, elements corresponding to those of FIGS. 1, 2a, 2b and 2c are designated by the same reference numberal. In FIG. 4, each diode 40-46 is connected in series with a corresponding resistor 440-446 to reduce the bias current which flows when the diode is forward biased. This causes the bias current to be more linearly related to the bias voltage, and reduces the need for very large currents when large numbers of diodes are conducting. If the resistors 440-446 were simply added in series with their respective diodes, the flow of the ac signal current through the resistance of the resistor would degrade the short-circuit established by the low dynamic impedance of the associated diode. The effect of resistors 440-446 on the ac signal is reduced or eliminated by paralleling each resistor with a capacitor. Capacitor 450 parallels resistor 440, thereby providing a low impedance path by which ac signal flowing from conductor 10 through diode 40 may reach conductor 12 without flowing through resistor 440. Similarly, capacitors 452, 454 and 456 parallel resistors 442, 444 and 446.

Figure 5A:
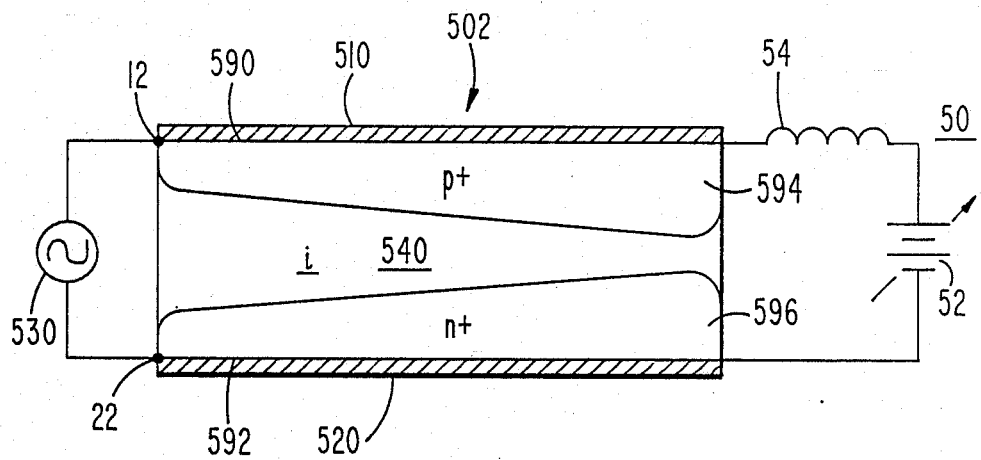
FIG. 5a is a partially pictorial, partially schematic representation of a distributed diode arrangement conceptually similar to the arrangement of FIG. 1.
Figure 5B:
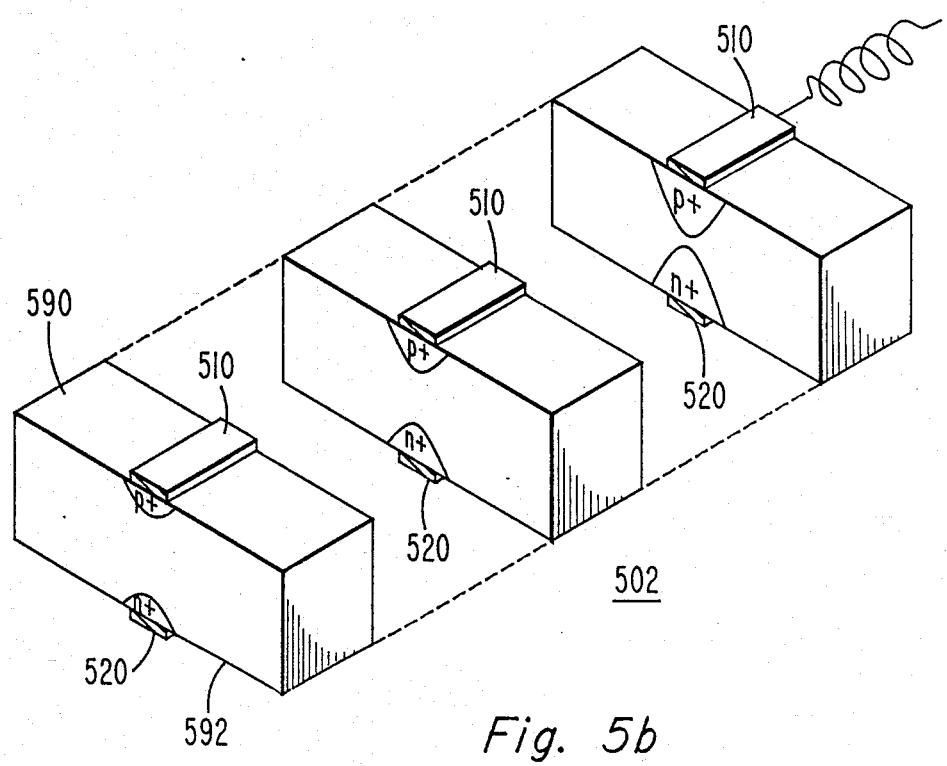

FIG. 5a is a partially pictorial, partially schematic representation of a cross section of a monolithic, distributed PIN diode arrangement conceptually similar to that of FIG. 1, but in which continuous control of the position of the short-circuit is possible, rather than the stepwise-continuous control provided by the discrete diodes of FIG. 1. FIG. 5b is an exploded, cross-sectional perspective view of the monolithic element of FIG. 5a. In the arrangement of FIGS. 5a and 5b, a monolithic chip designated generally as 502 has a generally flat shape, with upper and lower broad surfaces 590 and 592, respectively. The material of chip 502 is a semiconductor, such as silicon (Si), gallium arsenide (GaAs) or the like. The chip is doped with impurities to form a p+ region 594, adjacent upper surface 590, and an n+ region 596 adjacent lower surface 592. Such impurities are well known. In the case of a silicon chip, the p+ region is formed from Boron (B), and the n+ region is formed from Phosphorus (P). The impurity doped regions 594 and 596 are elongated, and are in registry so that they extend substantially parallel to each other along the upper (590) and lower (592) broad surfaces, respectively, of chip 502. Doped regions 594 and 596 together with the intervening region constitute an elongated PIN diode designated generally as 540.

A layer of metallization in the form of an elongated strip 510 is deposited or formed on upper surface 590 directly over p+ region 594. A similar layer of metallization in the form of an elongated strip 520 is deposited or formed on lower surface 592 directly under n+ region 596. Strips 510 and 520 are electrically conductive, and correspond to conductors 10 and 20 of FIGS. 1, and 2a, 2b, and 2c. Conductive strips 510 and 520 are effectively the conductive terminals of distributed PIN diode 540. As illustrated, conductive strips 510 and 520 are parallel and are similar to a two-wire transmission line. If conductive strip 520 completely covered lower surface 592 of chip 502, the transmission line structure would be more akin to a microstrip line. However, this situation would not affect the operation as hereinafter described.

Bias source 50 including variable voltage source 52 is coupled by a high impedance, in the form of a choke 54, to conductive strip 510. The other terminal of source 52 is connected to strip 520. A source 530 of alternating current at a millimeter-wave frequency (approximately 30 to 300 GHz) is connected to strips 510 and 520 at ac input terminals 12 and 22.

During operation, ac signals produced by source 530 at input terminals 12 and 22 propagate along the transmission line formed by conductive strips 510 and 520, and direct bias voltage is applied to strips 510 and 520 from bias source 50 to bias PIN diode 540.

As can be clearly seen in FIG. 5a, intrinsic (i) or lightly doped semiconductor material separates p+ region 594 and n+ region 596 everywhere. As can also be clearly seen in FIG. 5a, and as can be deduced from the various sections illustrated in FIG. 5b, the physical depth of the impurities in doped regions 594 and 596 as measured from their respective adjacent broad surfaces varies with position along the length of the doped portions. As a result, the separation between p+ and n+ regions, exaggerated for clarity, varies as a function of position on the chip. The length of intrinsic (i) material separating the p+ and n+ regions in the direction of current flow (vertically as illustrated in FIG. 5a) thus varies from point to point. More specifically, the path length in the vertical direction as illustrated in FIG. 5a between p+ region 594 and n+ region 596 is greater at the left of chip 502 than at the right, and the separation varies approximately linearly at points lying between the ends.

As described by Sze in "Physics of Semiconductor Devices, Second Edition, " published by Wiley, the nominal forward bias voltage $V_f$ of a PIN diode is approximately $$V_f = \frac{kT}{q} K_2 (W/L)^2 \quad (2)$$

where
k, T and q have already been defined, and
$K_2$ = a constant which depends on the type of semiconductor material and the doping;
L = the diffusion length in micrometers; and
W = the length of the intrinsic region in the direction of current flow, in micrometers ($\mu M$).

Since kT/q is a physical constant having a value of about 26 millivolts and $K_2$ has a valus of ⅜ for silicon, the forward bias or junction voltage of a silicon PIN diode at room temperature is $$V_f = 26mV (⅜) (W/L)^2 \quad (3)$$

Figure 6:
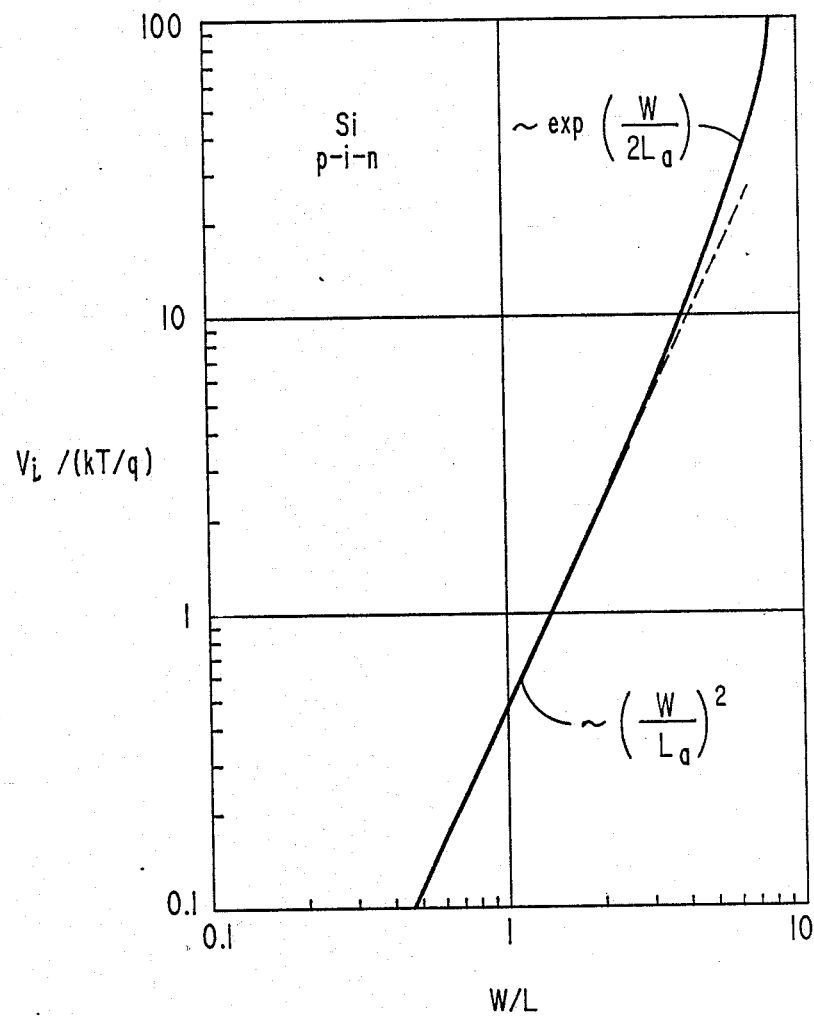
FIG. 6 is a plot of PIN diode forward-bias voltage.

Since the diffusion length (L) is a constant for a given doping condition, the only variable remaining in equation 3 is W, which is the length of the intrinsic region. Thus, the forward bias voltage depends upon the separation between the p+ and the n+ regions. FIG. 6 is a plot of forward bias voltage drop in the intrinsic region (which is approximately the forward bias voltage) as a function of the ratio W/L, from the Sze text. The structure illustrated in FIGS. 5a and 5b has a separation between p+ and n+ regions which varies as a function of position along the length of elongated PIN diode 540. Consequently, those portions, of distributed PIN diode 540 where the i portion separating the p+ and n+ regions has the shortest distance have the lowest forward dias voltage, and those portions where the i region separating the p+ and n+ regions is longest have the highest forward junction voltage. The lowest forward junction voltage therefore occurs in that portion of the distributed PIN idode 540 at the right of chip 502 as illustrated in FIG. 5a, and the highest forward junction voltagte occurs in the portion of diode 540 at the left of chip 502.

When the bias voltage produced by source 50 is slowly increased, distributed diode 540 will begin to conduct at some voltage. The conduction begins in the region having the closest spacing between p+ region 594 and n+ region 596. Other portions, having larger separations, will be nonconductive at that voltage. This condition is equivalent to the bias condition illustrated in FIG. 2a for a discrete diode circuit. The conducting region assumes a low dynamic impedance, equivalent to a short circuit, and the ac signals entering input terminals 12 and 22 are reflected from the low impedance portion in known manner. At a particular frequency at which the physical distance between the conducting region of PIN diode 540 and terminals 12, 22 is one quarter wavelength, the input impedance is high. This represents the lowest resonant frequency of the structure.

As the bias voltage is further increased, the forward conduction region grows, spreading towards the region of greater separation betwenne p+ region 594 and n+ region 596 (to the left in FIG. 5a). This is equivalent to the bias condition represented in FIG. 2b, in which the diode conduction occurs at a point between the end terminals of the transmission line. That portion of distributed PIN diode 540 of FIG. 5a and 5b which conducts and which is nearest to input terminals 12, 22 determines the effective position of the short-circuit between conductive strips 510 and 520, and establishes the impedance at input terminals 12 and 22. If the transmission line is viewed as a resonator, the resonant frequency increases progressively and as a continuous, monotonic function of the applied bias voltage.

At some bias voltage the entirety of distributed PIN diode 540 will be conducting. Thus, the effective location of the short-circuit will have moved to that location having the greatest length of intrinsic semiconductor separating p+ region 594 and n+ region 569, at the left end of chip 502 as represented in FIG. 5a. Further increases in bias voltage merely increase bias current without significant effect on the impedance at terminals 12, 22.

A distributed structure such as diode 502 is readily fabricated by conventional semiconductor processes. The variable depth impurity distribution can be achieved by ion implantation with energy which varies across the structure to vary the depth of implantation. Diffusion can also be used. In diffusion processes, it is usual to attempt to maintain the temperature of the wafer or chip completely uniform, because diffusion rate is strongly affected by minor temperature variations. In order to diffuse at a variable rate to achieve the impurity distribution of diode 502, one end of the wafer or chip is heat-sunk to a lower temperature in the diffusion reactor, which causes a temperature differential across the chip or wafer which in turn causes a diffusion rate difference.

Figure 7A:
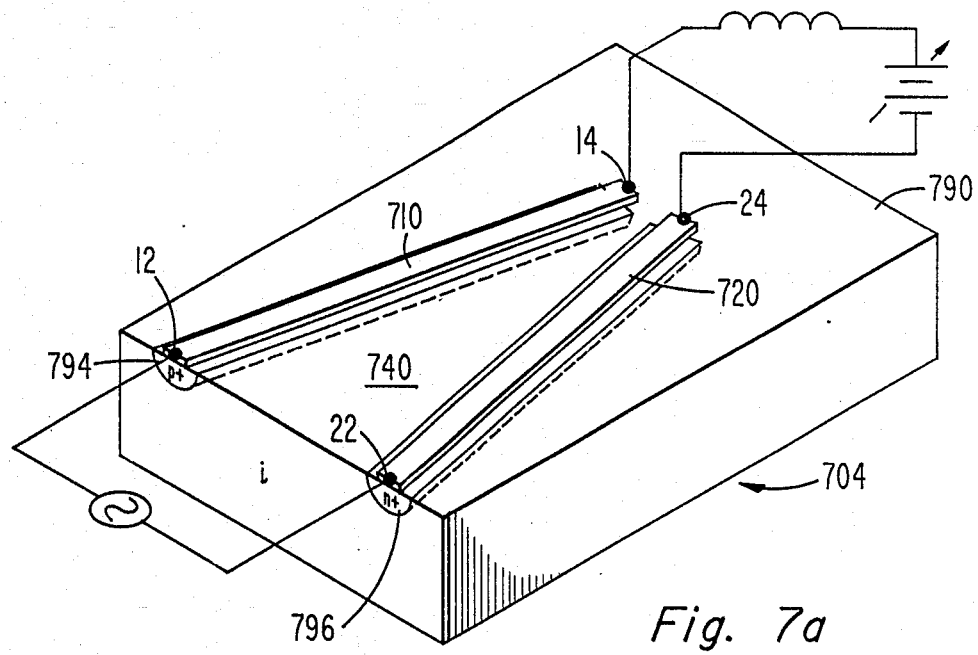
FIG. 7a is a perspective view of a lateral PIN diode according to another embodiment of the invention.
Figure 7B:
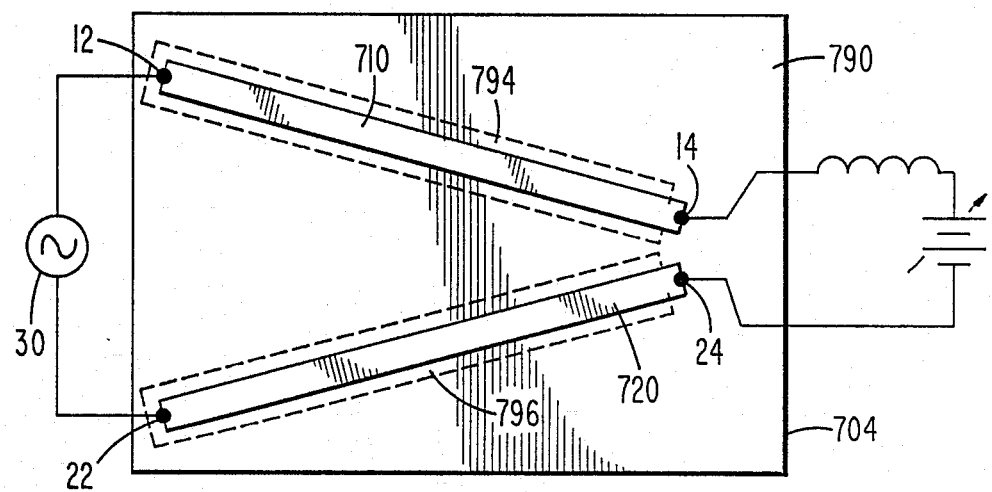
FIG. 7b is a plan view thereof.

An equivalent structure can be fabricated in the form of a lateral PIN diode, as illustrated in perspective view in FIG. 7a and in plan view in FIG. 7b. The structure of FIGS. 7a and 7b can be fabricated by conventional techniques. In FIG. 7a, a lightly doped or intrinsic (i) semiconductor chip 704 has a broad upper surface 790. Elongated P+ doped region 794 and elongated N+ doped region 796 are formed near upper surface 790 with their axes of elongation relatively skewed. The skew is exaggerated for illustrative purposes. As a result, doped regions 794 and 796 are closer together at one end than at the other end. The i region between P+ doped region 794 and N+doped region 796 defines a PIN diode designated generally as 740 which has a variable intrinsic separation and which as discussed above therefore displays a variable forward-bias junction voltage. Overlying P+ doped region 794 is an elongated conductive strip 710, defining an input terminal 12 at one end thereof and a terminal 14 at the other end thereof. Similarly, an elongated conductive strip 720 overlies N+ doped region 796 and defines a second input terminal 22 at one end and a terminal 24 at the other end. Input terminals 12 and 22 are connected to a source of alternating current. Bias source 50 is connected to terminals 14 and 24.

Figure 8:
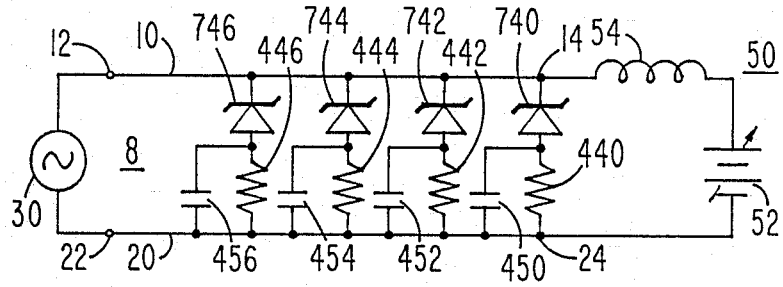
FIG. 8 is a partially pictorial and partially schematic representation of an embodiment of the invention utilizing discrete zener diodes.

FIG. 8 is an embodiment of the invention utilizing zener diodes rather than junction or PIN diodes. Elements of the arrangement of FIG. 8 corresponding to those of FIG. 4 are designated by the same reference numerals. In the arrangement of FIG. 8, a zener diode 740 has its cathode connected to terminal 14 of transmission line 8, and its anode connected by way of a bias current limiting resistor 440 and ac bypass capacitor 450 to terminal 24. Similarly, a zener diode 742 has its cathode connected to a point on conductor 10 between terminals 12 and 14, and its anode connected by way of a bias current limiting resistor 442 and a capacitor 452 to a corresponding point on conductor 12. In a similar manner, a zener diode 744 is connected with resistor 444 and a capacitor 454, and a further zener diode 746 is connected with a resistor 446 and with a capacitor 456 at separate discrete locations between conductors 10 and 12 of transmission line 8. Diodes 740, 742, 744 and 746 are selected to havve progressively increasing zener or avalanche operating voltages. For example, diode 740 may have a zener operating voltage of 5.6 volts; idode 742 an operating voltage of 6.2 volts; diode 744, 6.8 volts; and diode 746, 7.5 volts. With such a selection of diode zener voltage, the effective position of a short-circuit will move from a position between terminals 14 and 24 in a stepwise manner towards input terminals 12 and 22 of transmission line 8 as the bias voltage rises from 5.6 volts to 7.5 volts. In the absence of current limiting resistors and ac bypass capacitors, the bias current would become very large, as suggested by plot 300 in FIG. 3, while the arrangement as illustrated in FIG. 8 has a bias current which increases at a relatively modest rate by comparison with the plot of FIG. 3.

Figure 9:
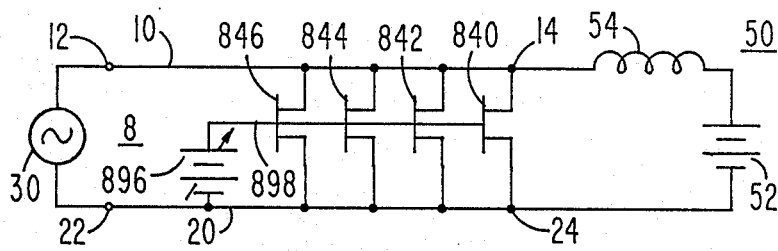
FIG. 9 is a partially schematic diagram of another embodiment of the invention utilizing field effect transistors.

FIG. 9 is a schematic diagram of an embodiment of the invention using field effect transistors (FETs). In FIG. 9, elements corresponding to those of FIG. 1 are designated by the same reference numerals. These arrangements are advantageous by virtue of relatively low total bias currents. In FIG. 9, a field effect transistor 840 has its source connected to terminal 24 on conductor 20, and its drain connected to terminal 14 at a corresponding point on conductor 10. Its base is connected by a conductor 898 to a gate bias battery 896. Further field effect transistors 842, 844 and 846 have their sources and drains connected at corresponding pairs of points on conductors 10 and 20 between terminal pair 14, 24 and ac input terminals 12, 22. The gates of FETs 842, 844 and 846 are interconnected by conductor 898 to the gate of FET 840 and to gate bias battery 896. The correspondence of the arrangement of FIG. 9 to that of FIG. 1 is apparent. Field effect transistors 840, 842, 844 and 846 are dissimilar. Unlike the arrangement of FIG. 1, battery 52 produces a constant bias voltage selected for interacting with the variable voltage produced by gate bias battery 896 to produce the desired conduction characteristic. Thus, the drain-to-source voltages of FETs 840, 842, 844 and 846 are equal.

Figure 10A:
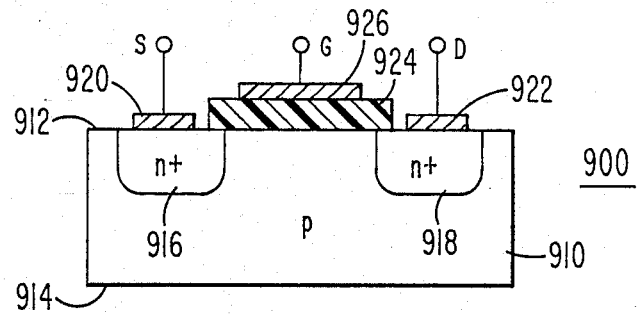
FIGS. 10a, 10b, 10c and 10d are representations of the cross-section of a conventional MOSFET aiding in understanding the operation thereof.
Figure 10B:
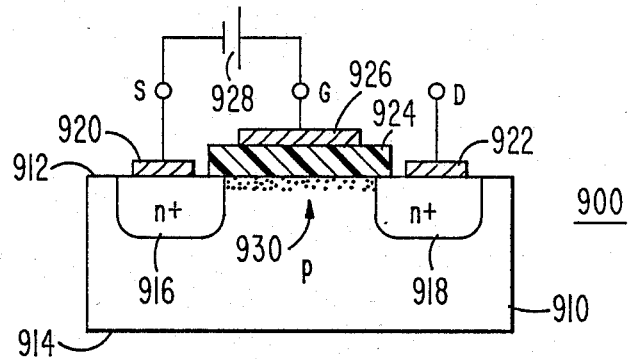

FIG. 10a through 10b are conventional representations of the cross section of an n-channel metal oxide semiconductor field effect transistor (MOSFET). In FIG. 10a, MOSFET 900 includes a moderately p-doped semiconductor chip 910 which has an upper surface 912 and a lower surface 914. Adjacent to upper surface 912 are two heavily doped n+ regions 916 and 918. Metallizations 920 and 922 overlying n+ regions 916 and 918, respectively, form ohmic contacts thereto, and constitute the source (S) and drain (D) contacts or electrodes. Extending between n+ regions 916 and 918 on upper surface 912 is a insulating layer 924, normally a layer of oxide or polysilicon. Overlaying insulating layer 924 is a further metallization 926 which represents the gate electrode.

Figure 10C:
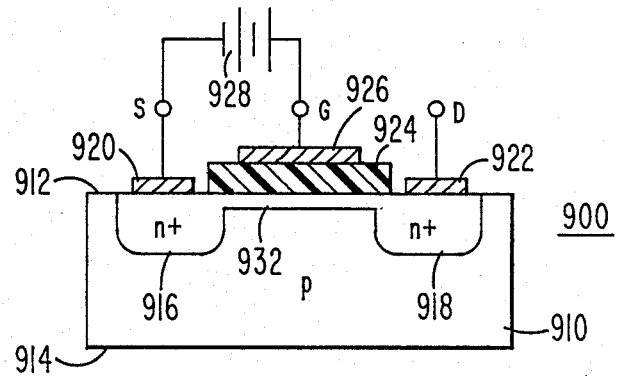
Figure 10D:
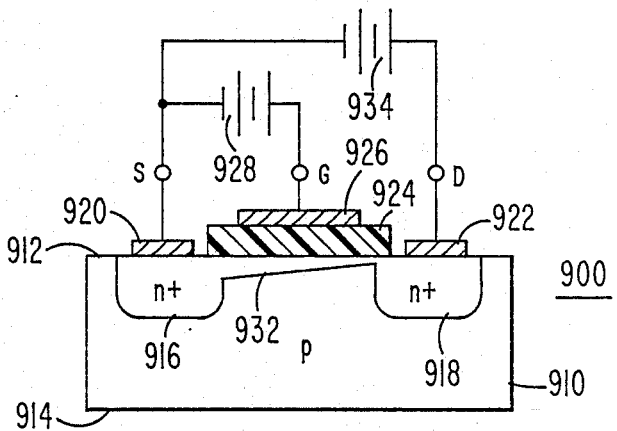

If the gate electrode (metallization 926) of the MOSFET of FIG. 10a is left disconnected, and a drain-to-source voltage ($V_{GS}$) is applied, no current will flow, because one or the other of the diodes formed by n+ regions 916 or 918 with p substrate 910 will become reverse biased. Elements of FIGS. 10b, 10c and 10d corresponding to those of FIG. 10a are designated by the same reference numeral. FIG. 10b illustrates the application of a gate-to-source bias voltage by means of a battery illustrated as 928, poled to make gate electrode 926 positive with respect to the source. No direct current flows in the gate electrode because of the insulating properties of insulating layer 924. Gate metallization 926 assumes a positive charge, and a corresponding negative charge is induced near surface 912 of substrate 912, as illustrated by stippled region 930. The charge arises from electrons drawn from source and drain regions 916 and 918. These electrons are attracted to the region under electrode 926. The charge is also formed by holes which are repelled from the region under electrode 926. FIG. 10c illustrates the condition of MOS-FET 900 with a $V_{GS}$ greater than that illustrated in FIG. 10b. In FIG. 10c, the gate-to-source bias voltage is sufficiently large to exceed the threshold voltage ($V_T$) at which sufficient electrons are concentrated in the substrate near surface 912 to overcome the positive charge attributable to the p substrate doping. Thus, when $V_{GS}$ equals $V_T$ the phenomenon of "inversion" occurs in which the portion of the substrate just under the gate changes its polarity from p to n, which means that the majority carriers are electrons. In FIG. 10c, the region of inversion is illlustrated as a channel 932 extending between n+ source region 916 and n+ drain region 918. Clearly, a lesser value of $V_{GS}$ is required to create an inversion channel if the thickness of insulating layer 924 is very thin, because the electric field intensity near surface 912 is greater than for a thick insulating layer. Similarly, a thick insulating layer 924 requires a greater $V_{GS}$ bias voltage in order to create an inversion channel by which conduction can occur between source region 916 and drain region 918. Alternatively, a lesser value of $V_{GS}$ is necessary to cause inversion in a lightly doped substrate situation by comparison with a heavily doped substrate. When a drain-to-source voltage ($V_{DS}$) is applied in such a manner to make the drain positive with respect to the source, electron current flows through channel 932 from source to drain. Since the channel has resistance, a voltage drop occurs along channel 932 which tends to make that portion of channel 932 nearest drain 918 more positive than that portion near source 916. This field configuration tends to oppose the gate field which cause the inversion, resulting in a variation in the width of the channel 932 between the source and the drain. It is clear that a relatively large $V_{DS}$ voltage will tend to decrease the width of the channel more than a relatively low $V_{DS}$. At relatively high values of $V_{DS}$ relative to $V_{GS}$, the channel is "pinched off", and draws only a constant current.

Figure 11A:
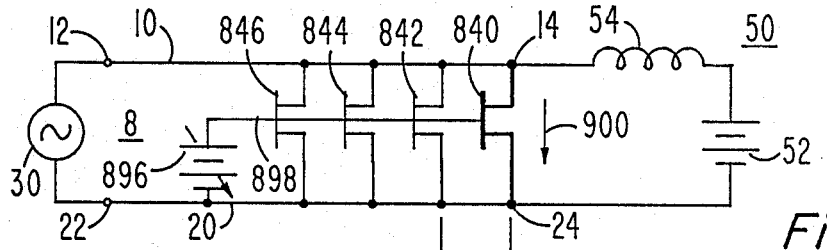
FIGS. 11a, 11b and 11c are schematic diagrams similar to that of FIG. 9 illustrating the effect of various bias voltages.
Figure 11B:
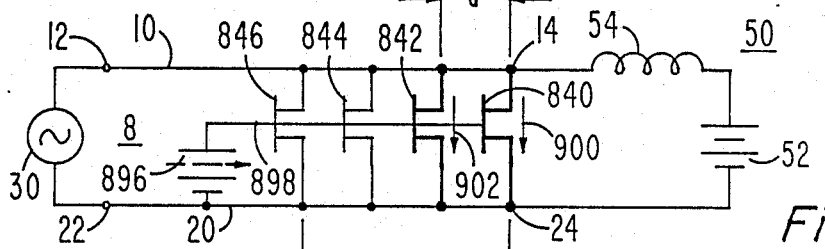

In the arrangement of FIG. 9, transistors 840–846 are MOSFETs such as that illustrated in FIG. 10a. However, the threshold voltages $V_T$ of transistors 840–846 increase with their proximity to input terminals 12, 22 and away from terminals 14, 24. For example, transistors 840–846 may be identical except for the initial doping level of the p substrate, with transistor 840 having the most lightly doped substrate and transistor 846 having the most heavily doped substrate. This variation might cause transistor 840 to have, for example, a threshold voltage of one volt; transistor 842, a threshold voltage of 1.5 volts; 2.0 volts for transistor 844; and 2.5 volts for transistor 846. With the transistors selected in this manner, at threshold voltages below 1.0 volts, all the transistors have nonconductive drain-to-source channels. This corresponds to the presentation of a high impedance condition by the drain-to-source path of all the transistors to transmission line 8. At a bias voltage equal to one volt, produced by gate bias battery 896 on conductor 898, transistor 840 becomes conductive to produce a relatively low impedance between terminals 14 and 24, analogous to the low impedance produced by diode 40 of FIG. 1 in its conductive condition. As described proviously, this effectively short-circuits transmission line 8 between terminals 14 and 24, affects the impedance seen at input terminals 12 and 14, and sets up a resonant frequency of the line. This condition is illustrated in FIG 10a. In FIG. 11a, and in FIGS. 11b, 11c and 11d, elements corresponding to those of FIG. 9 are designated by the same reference numeral. In FIG. 11a, the flow of bias current through transistor 840 from source 50 is represented by an arrow 900. The low ac impedance presented by transistor 840 to conductors 10 and 20 of transmission line 8 is represented by the heavy lines connecting transistor 840 to terminals 14 and 24.

Figure 11C:
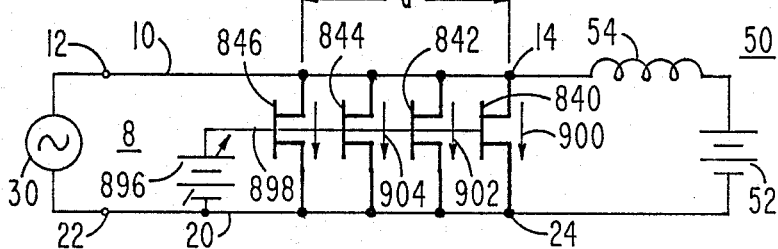

At a somewhat higher level of bias voltage produced by gate bias battery 896 on conductor 898, as for example 1.5 volts, transistor 842 also becomes conductive, allowing additional bias current to flow as illustrated by arrow 902, and producing a low impedance between conductors 10 and 20 at a point between terminals 14 and 24 and input terminals 12 and 22. This represents a step movement of the short circuit by the distance d towards the input terminals. FIG. 11c represents the corresponding condition with the voltage produced by bias battery 896 at its maximum value of 2.5 volts, causing all of the transistors to become conductive and causing the effective position of the short circuit across conductors 10 and 20 of transmission line 8 to make its closest approach to input terminals 12 and 22.

Figure 12:
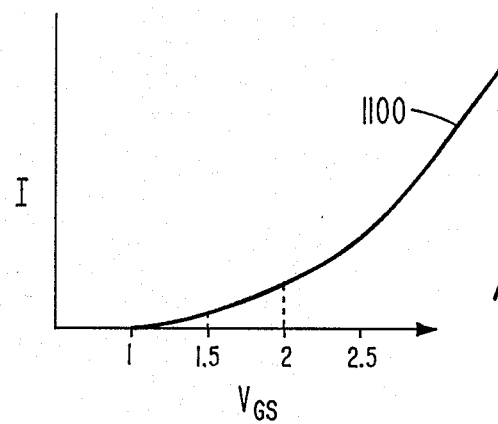
FIG. 12 is a plot of bias current versus bias voltage for the arrangement of FIG. 9.

FIG. 12 illustrates as 1100 the stepwise-linear total current which flows in bias supply 50 of the arrangement of FIG. 9 as a function of gate bias voltage. As illustrated by the plot, no current is drawn by source 50 at gate voltages below 1.0 volt. In the region between 1 and 1.5 volts of applied gate-to-source voltage, a relatively low current is drawn by bias source 50. At $V_{GS}$ between 1.5 and 2 volts two transistors are conducting, and the slope is greater than in the region of 1 to 1.5 volts. Progressively more current is drawn and the slope of the curve becomes steeper as more transistors become conductive at higher values of $V_{GS}$.

Figure 13A:
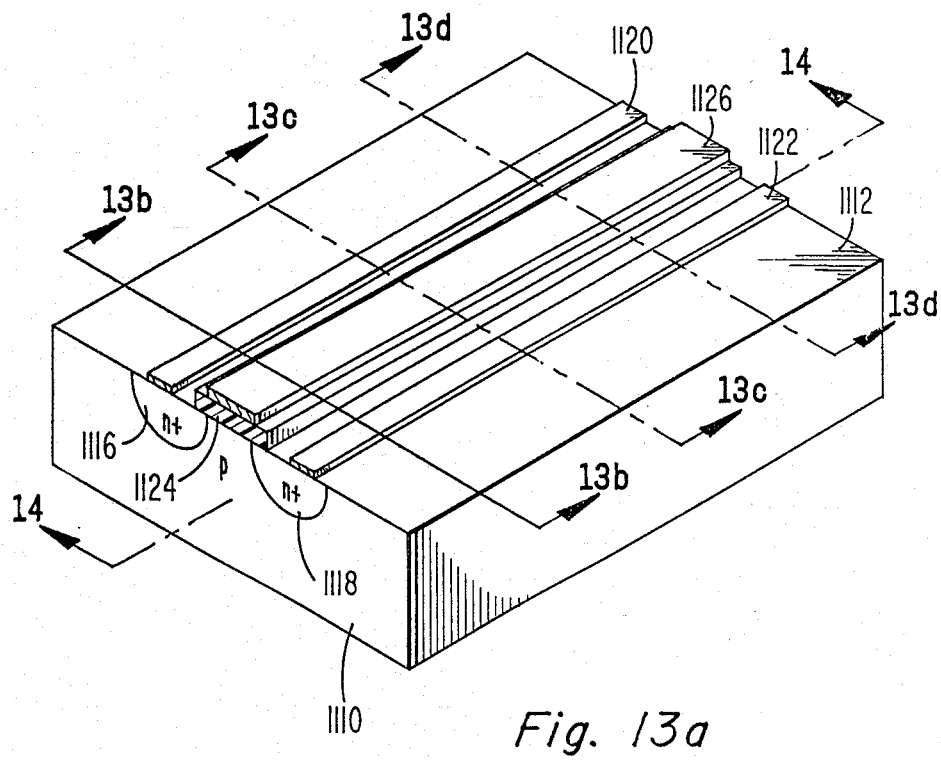
FIG. 13a is a perspective view of a distributed semiconductor arrangement conceptually similar to the arrangement of FIG. 9 but providing continuous range of control.
Figure 13B:
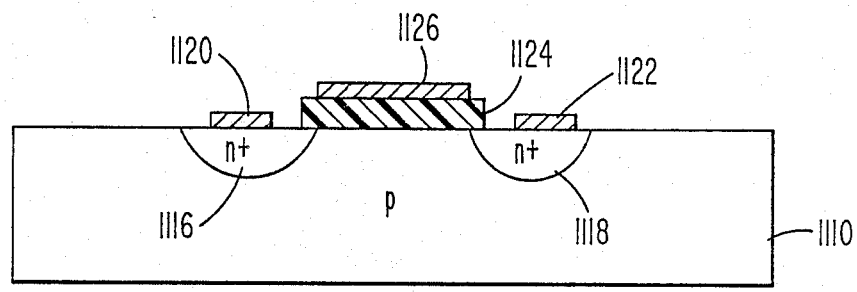
FIGS. 13b, 13c and 13d are cross sections of the arrangement FIG. 13a at various positions along its length.

FIG. 13a is a perspective view of an elongated MOSFET in accordance with an embodiment of the invention which provides continuous rather than stepwise control of the effective position of a short-circuit between two conductors. FIGS. 13b, and 13d are lateral cross sections of the structure illustrated in FIG. 13a taken along the section lines B—B, C—C and D—D, respectively. Elements of FIGS. 13b, 13c and 13d corresponding to those of FIG. 13a are designated by the same reference numerals. FIG. 14 is a perspective view of the structure of FIG. 13a divided along a longitudinal section line to illustrate the longitudinal cross sections. As illustrated in FIG. 13a, a moderately p−doped substrate 1110 has a flat upper surface 1112. Adjacent flat upper surface 1112 is an elongated n+ doped region 1116. Running approximately parallel to doped region 1116 is a further elongated n+ doped region 1118. An elongated conductive metallization strip 1120 overlies elongated n+ region 1116, and a similar elongated conductive strip 1122 overlies elongated n+ region 1118. An elongated layer of oxide insulation illustrated as 1124 is deposited on surface 1112 between conductive strips 1120 and 1122. In FIGS. 13a and 14, the width of the oxide layer is depicted as narrower than the actual width, for clarity of illustration. As described below, the thickness of oxide 1124 is tapered along the length of the elongated structure. Atop insulating layer 1124 is a metallized layer 1126.

Figure 13C:
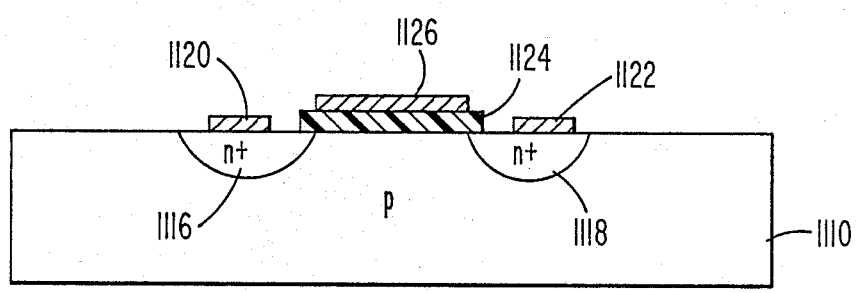
Figure 13D:
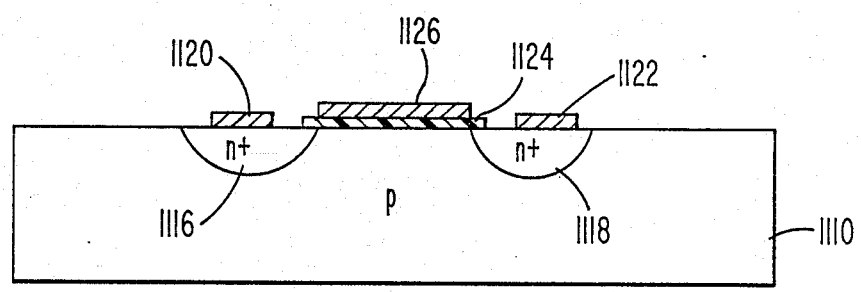
Figure 14:
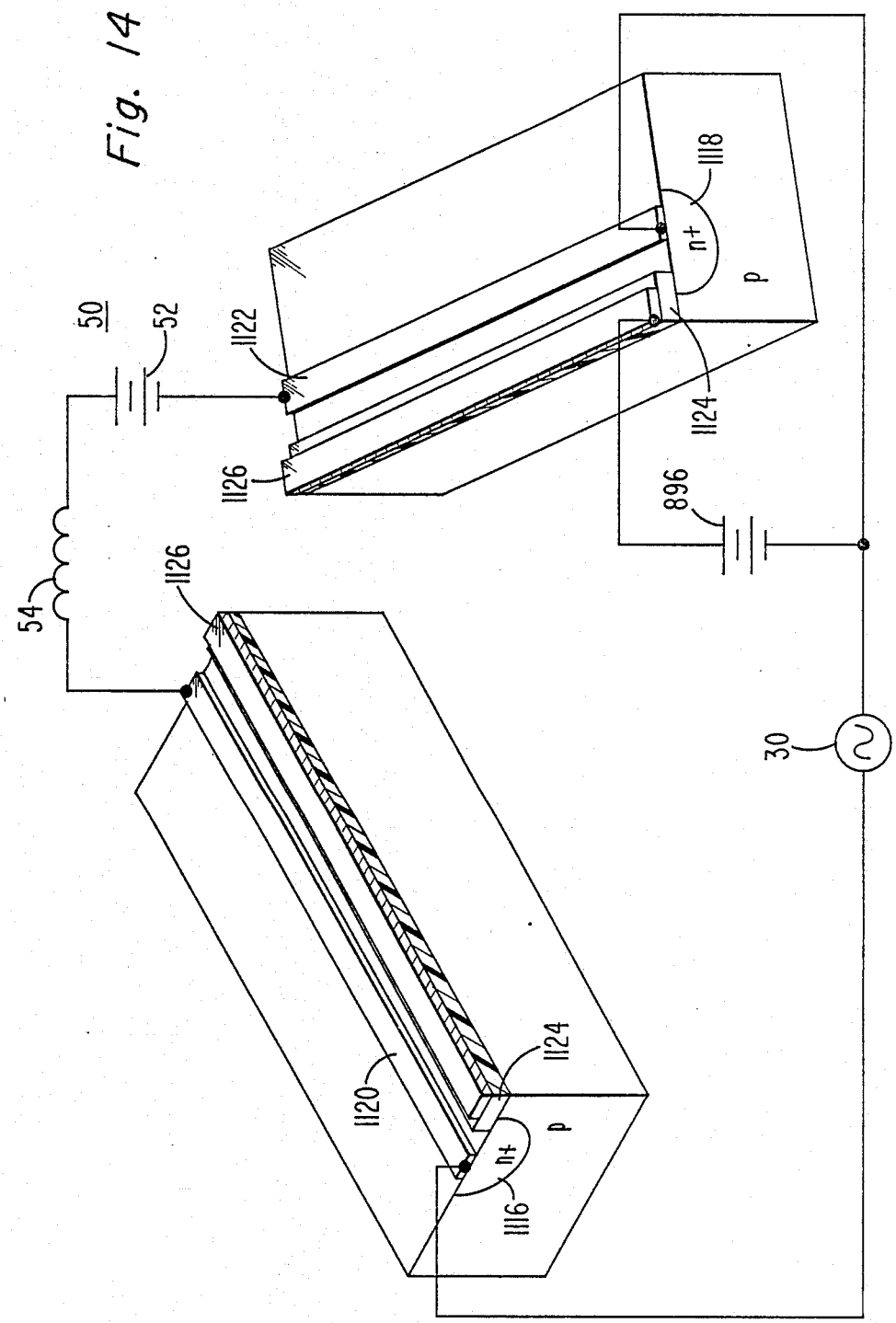
FIG. 14 is a view of the structure illustrated in FIG. 13a sectioned lengthwise to illustrate its structure.

The cross-section of FIGS. 13b, 13c and 13d are identical, except for the thickness of insulating layer 1124. As illustrated in FIG. 13b, corresponding to cross-section location B—B of FIG. 13a, insulator 1124 has its maximum thickness. By contrast, the cross-section of FIG. 13d, corresponding to cross-section location D—D of FIG. 13a, has the least thickness of insulating layer 1124. The cross-section of FIG. 13c at a location intermediate those of FIG. 13b and 13d has an intermediate thickness of insulator 1124. As mentioned above, the thickness of the insulation layer is related to the threshold voltage. In particular, a thicker insulation layer is associated with a higher threshold voltage $V_T$. Consequently, a portion of the elongated MOSFET illustrated in FIG. 13b has the highest threshold voltage, and that portion illustrated in FIG. 13d has the lowest threshold voltage. The central portion of the structure has an intermediate value of threshold voltage.

Figure 15A:
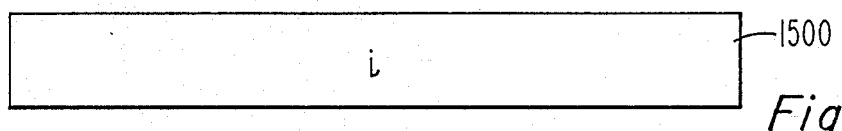
FIGS. 15a–15c represent various stages in the fabrication of a tapered insulation layer.
Figure 15B:
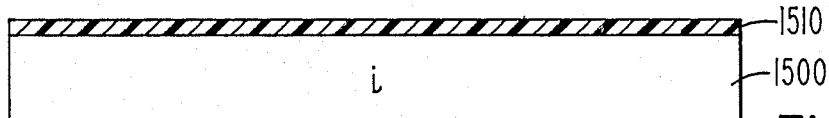
Figure 15C:
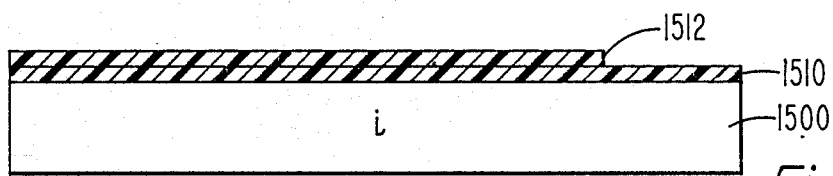
Figure 15D:
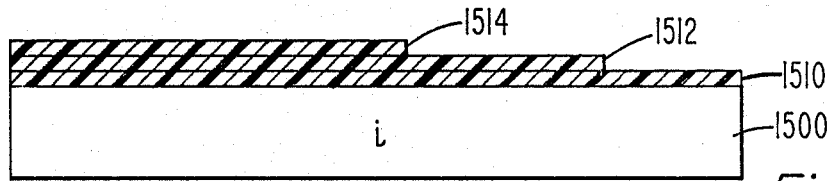
Figure 15E:
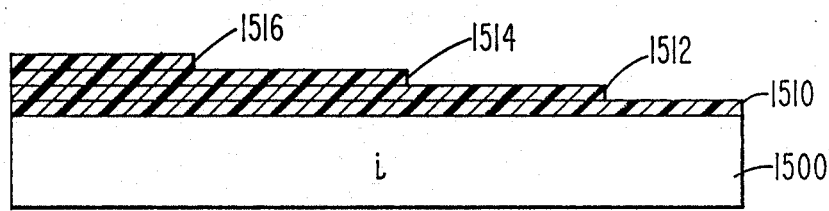
Figure 15F:
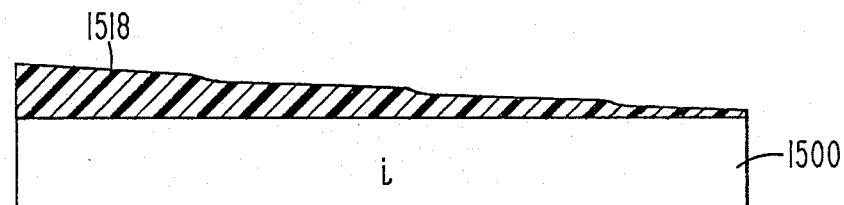
Figure 15G:
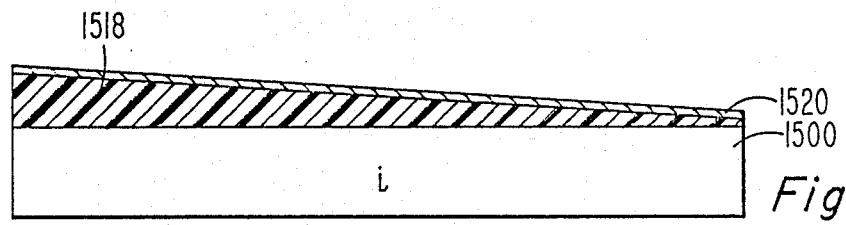

FIG. 15a represents a cross-section of a semiconductor substrate 1500, corresponding to a substrate such as 1110 of FIG. 13a, upon which a tapered oxide is to be formed for use as a portion of a gate of a MOSFET. FIG. 15b represents the deposition onto substrate 1500 of an insulating layer 1510. FIG. 15c illustrates the result of masking a portion of the structure of FIG. 15b, and depositing on top of insulating layer 1510 a second insulating layer 1512. FIG. 15d illustrates the result of masking a portion of the structure of FIG. 15c and depositing a further insulation layer 1514. The result of yet a further masking and insulation deposition is illustrated in FIG. 15e, in which insulation layer 1516 has been added. The insulting layers of FIG. 15e are then exposed to a corrosive bath, which preferentially removes points, leaving a tapered layer designated 1518. Lastly, a layer of metallization illustrated as 1520 is deposited over tapered insulation layer 1518, as illustrated in FIG. 15g.

Figure 16A:
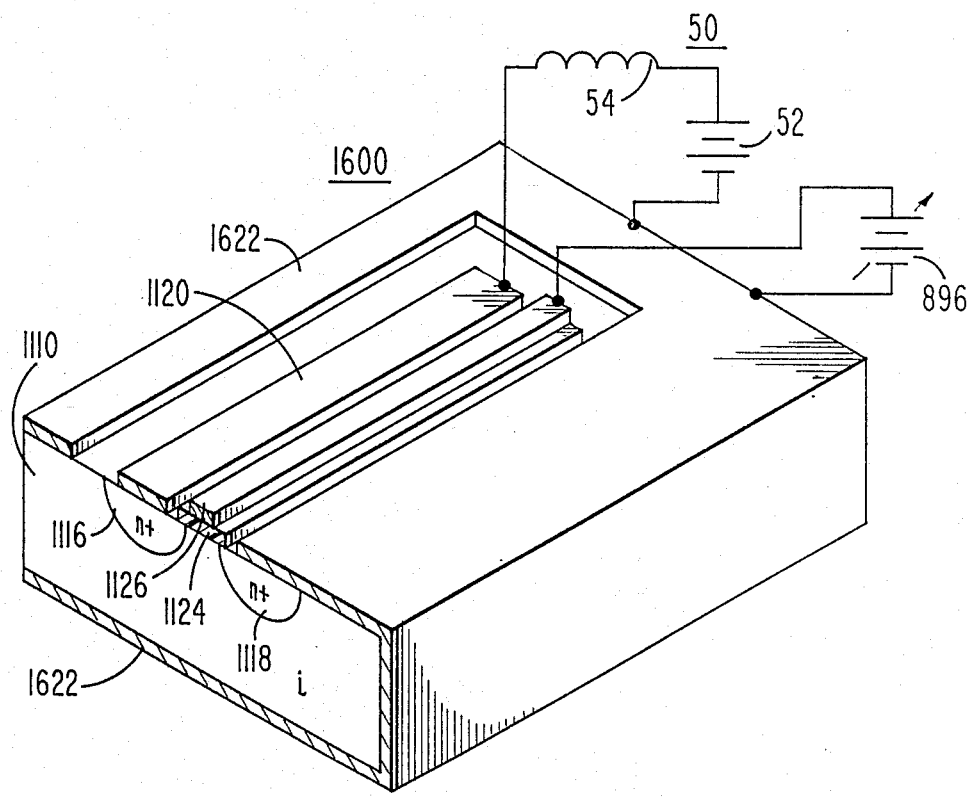
FIG. 16a a perspective view of a semiconductor arranged as a microstrip stub tuner.
Figure 16B:
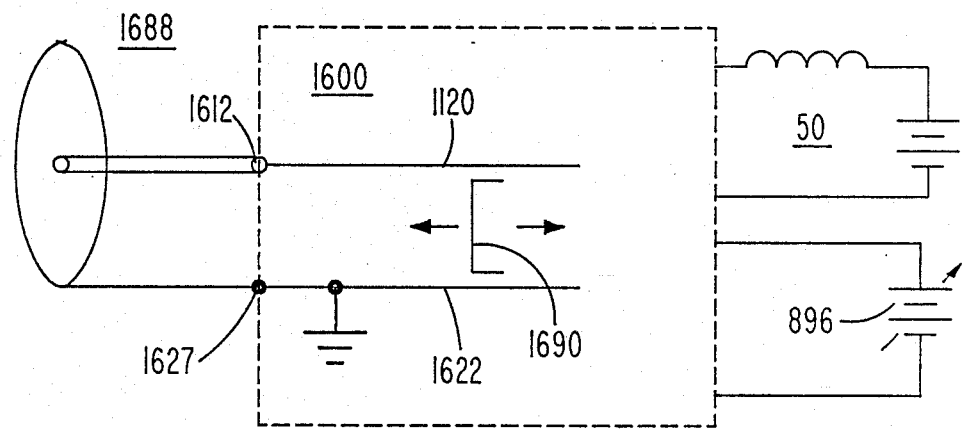
FIG. 16b is a scematic representation thereof.

FIG. 16a illustrates a monolithic semiconductor arrangement generally similar to the structure of FIG. 13a arranged in a microstrip configuration as a stub tuner or electrically positionable short-circuit 1600. In FIG. 16a, elements corresponding to those of FIG. 13a are designated by the same reference numberal. The major difference between the arrangement of FIG. 13a, and that illustrated in FIG. 16a, is that the metallization or conductor overlying n+ doped region 1118 is extended into a broad ground plane which folds under semiconductor 1110. Ground plane conductor 1622 coacts with strip conductor 1120 to form a microstrip transmission line. In the microstrip transmission line, strip conductor 1120 is the topological transformation of the center conductor of an equivalent coaxial transmission line, and ground conductor 1622 is the equivalent of the outer conductor of a coaxial transmission line. FIG. 16b is a schematic representation of the arrangement of 16a in which corresponding elements are designated by the same reference numerals. The schematic representation of FIG. 16b includes a ground conductor 1622 and a further conductor 1120 coacting to form a transmission line, and also includes a short-circuit illustrated as 1690 which is mechanically movable along the transmission line. Fixed bias supply 50 and gate bias battery 896 are illustrated as connected for energization of the system. A coaxial transmission line desingated generally as 1688 is illustrated as being connected to input terminal 1612 and 1622 of electrically positionable short-circuit 1600.

Figure 17A:
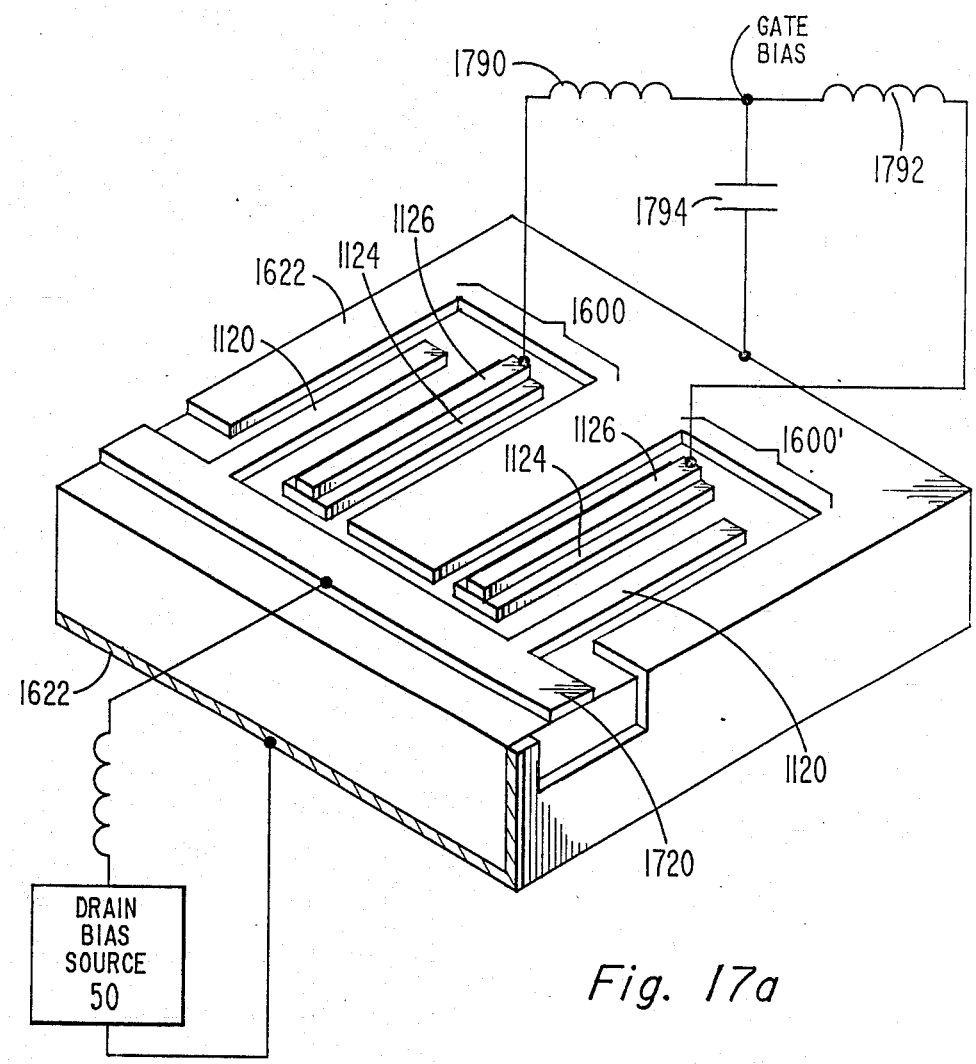
FIG. 17a is a perspective view of a semiconductor arrangement constituting a double stub tuner.
Figure 17B:
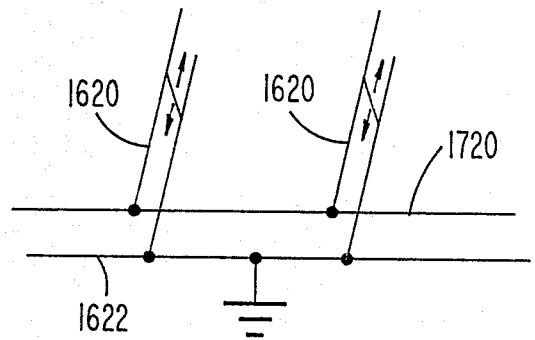
FIG. 17b is a schematic representation thereof.

FIG. 17a illustrates, in perspective view, a section of a semiconductor substrate which is the monolithic equivalent of a double tuner. As illustrated in FIG. 17a, the structure includes two portions designated 1600 and 1600', each of which is equivalent to stub tuner 1600 of FIG. 16a. In the arrangement of FIG. 17a, the near ends of conductors 1120 of the two stub tuners 1600 are interconnected by a strip conductor designated 1720. Drain bias source 50 is connected in common to both tuners 1600 by connection to common strip conductors 1720. Gate bias is applied in common to both gate conductors 1126, and interaction of the stub tuners is avioded by application of the common gate bias to the common point of a splitting low pass filter including inductors 1790, 1792 and a common capacitor 1794. FIG. 17b illustrates in semipictorial form the equivalent microwave structive of FIG. 17a. Naturally, independent gate bias sources may be applied to gate conductor 1126 for independent control of the position of the short circuits illustrated therein.

Figure 18A:
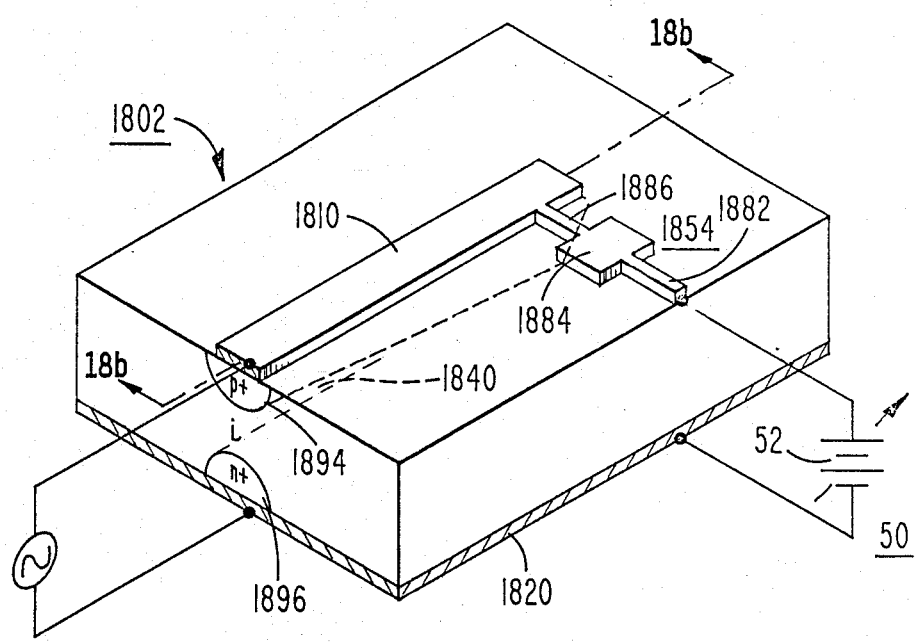
FIG. 18a is a perspective view of an antenna according to another aspect of the invention which is tuned by an electrically positionable short circuit.
Figure 18B:
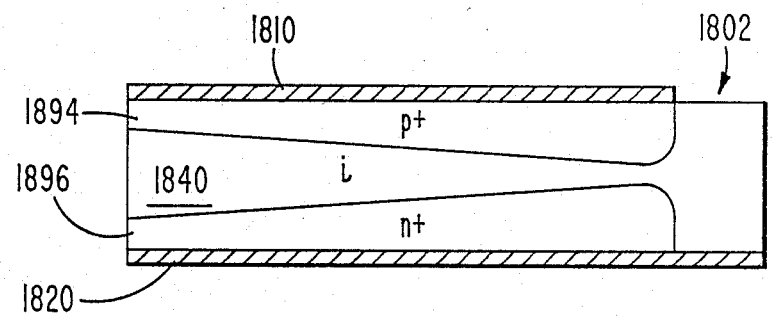
FIG. 18b is a cross-section of the arrangement of FIG. 18a taken along section lines 18B—18B.

FIG. 18a is a perspective representation of a structure similar to that illustrated in FIG. 5a and 5b, arranged as a tunable antenna. FIG. 18b is a cross section of the arrangement of FIG. 18a looking in the direction of section lines 18B—18B. The structure illustrated in FIG. 18a includes a monolithic semiconductor chip designated generally as 1802 which is for the most part intrinsic or lightly doped. Extending over the entire lower surface of chip 1802 is a conductive ground metallization 1820. An elongated strip conductor 1810 overlies the upper surface of chip 1802. As so far described, the structure is similar to a so-called "patch" antenna used at microwave and millimeter wave frequencies. It is known to tune a patch antenna by changing its effective physical size by making connections between the patch conductor and the ground plane with conductor pins. It is also known to tune patch antennas by the use of discrete switching semiconductors connecting between the conductive patch and the ground plane. In accordance with the invention, semiconductor 1802 is doped with p+ region 1894 and n+ region 1896 to a variable depth, as illustrated in FIG. 18b, to form a distributed PIN diode designated generally as 1840 having a variable separation arranged so that, when biased, a short circuit is electrically positionable therein. The electrically positionable short circuit is in effect a continuously positionable shorting pin which provides continuous tuning of the aperture size of the patch antenna.

In FIG. 18a, bias is applied to PIN diode 1840 by a bias source 50 including a variable voltage source illustrated as a battery 52 connected to a low pass filter designated generally as 1854. Filter 1854 includes a high impedance element formed as a conductive strip 1886 having narrow cross sectional dimensions which is connected to conductive patch 1810 and which is connected at its other end to a low impedance capacitor-like element 1884. A further high impedance element strip 1882, having narrow dimensions, connects element 1884 to battery 52.

The electrically positionable short-circuit can also be used as an electrically positionable "line stretcher."

Figure 19:
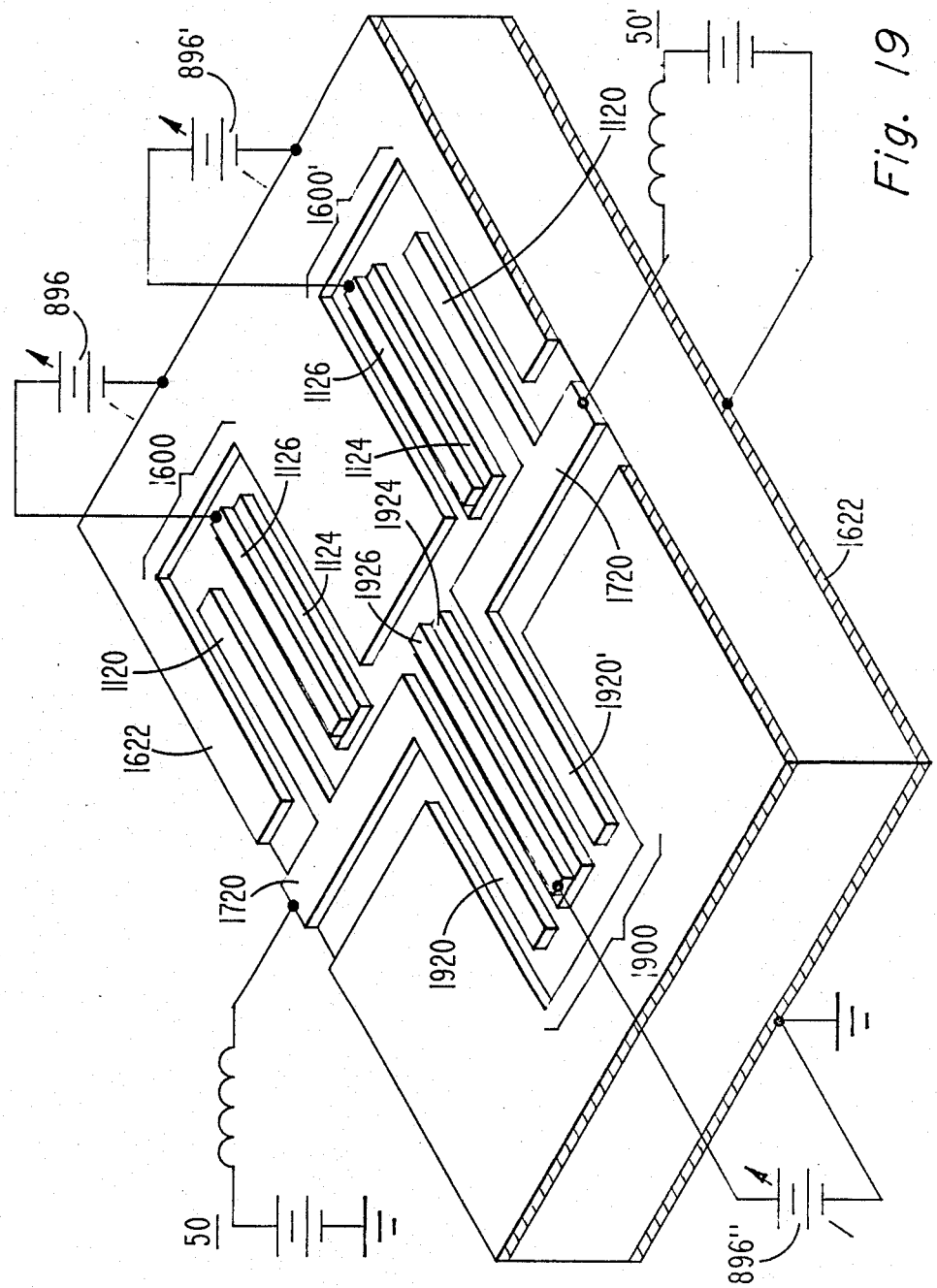
FIG. 19 illustrates a monolithic double stub tuner separated by an electrically positionable line stretcher.

This unit is the electrical equivalent of a mechanical contrivance consisting of a pair of nested coaxial transmission lines which are mechanically slidable relative to each other in such a fashion that they are equivalent to a transmission line of variable length. Such a structure is the prototype of a variable phase shifter. Thus, the electrically positionable short circuit can be used as a phase shifter. FIG. 19 illustrates a structure similar to that of FIG. 17a, but in which the pair of electrically positionable short-circuited stubs are separated by an electrically variable length of transmission line. Elements of FIG. 19 corresponding to those of FIGS. 16 and 17 are designated by the same reference numerals.

In FIG. 19, strip conductor 1720 is split at a point between electrically positionable short-circuited stubs 1600 and 1600'. That portion of strip conductor 1720 connected to stub 1600 is connected to a further strip conductor 1920, and that portion of strip conductor 1720 connected to stub 1600' is connected to a further conductive strip 1920' which runs parallel to strip 1920. Strips 1920 and 1920' overlie the intrinsic semiconductor. An elongated strip conductor 1926 overlies an insulator 1924 located between conductive strips 1920 and 1920', to form a MOSFET structure having elongated strip conductors 1920 and 1920' as the source and gate electrodes. As described in conjunction with the discussion of FIG. 13a-d and 14, structure 1900 forms a distributed MOSFET. By tapering the thickness of insulator 1924, or by varying the impurity density in the semiconductor under insulator 1924 along its length as discussed above, a variation of conduction position as a function of applied gate voltage can be achieved. If the thickness of insulator 1924 is least nearest the viewer, conduction begins at the lowest gate voltage, between the ends of conductors 1920 and 1920' at the end most remote from strip conductor 1720 thereby creating the greatest path length between stubs 1600, 1600'. With increasing gate bias voltage applied to gate electrode 1926, conduction between conductors 1920, 1920' progressively moves towards strip conductor 1720, thereby decreasing the path length between stubs 1600, 1600'.

Figure 20A:
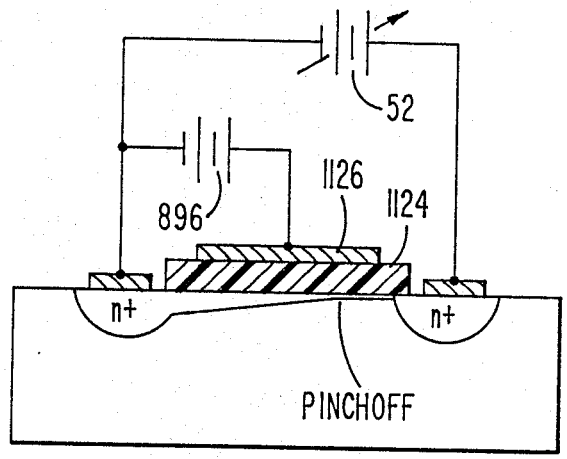
FIGS. 20a, 20b and 20c are cross sections of a MOSFET biased into various degrees of pinchoff and into resistive conduction.
Figure 20B:
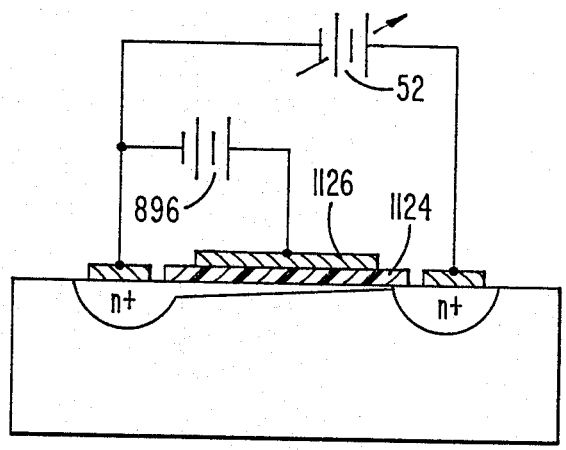
Figure 20C:
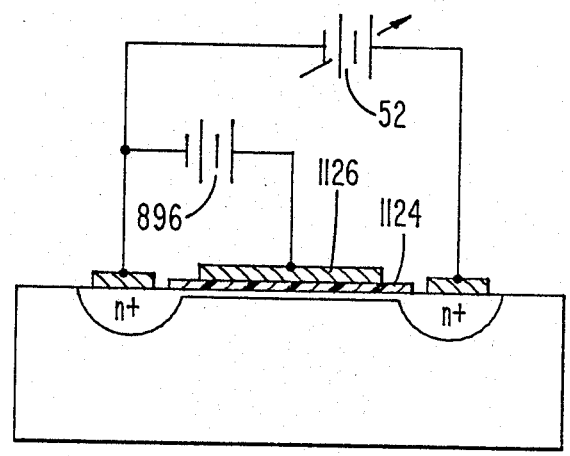

An entirely different mode of operation of the MOSFET structure is possible. In this mode of operation, the high impedance to ac signal is provided by a pinchoff or constant-current portion of the MOSFET characteristic, controlled by selection or variation of the source-to-drain bias voltage, rather than by selection of the gate-to-source voltage. In FIGS. 20a, 20b and 20c, thress cross-sections of a distributed MOSFET are illustrated. The thickness of insulator 2024 is greatest in FIG. 20a, and least in FIG. 20c. At any cross section, the channel may be resistively conductive or it may be pinched off, which is a condition of constant current conduction. For a given gate bias voltage provided by gate battery 896, the channel will be resistively conductive when the drain-to-source bias voltage $V_{DS}$ is low relative to the field produced by the gate-to-source bias voltage, and will be in constant-current pinchoff when $V_{DS}$ is much greater than $V_{GS}$. Consequently, at a given $V_{GS}$, the location along the distributed MOSFET at which conduction changes from resistive to constant-current can be modified by varying $V_{DS}$. While the constant-current conductive portion draws a bias current, to the alternating-current signal it is an open circuit. This occurs because variations of the voltage attributable to the ac signal do not cause a change in the current (so long as the ac signal voltage is much less than the $V_{DS}$ bias voltage). Zero ac current in response to an applied ac voltage is the definition of an ac open circuit.

In FIG. 20a, the insulator 1124 is thick, so the $V_{GS}$ field is small in magnitude. Consequently, at a given $V_{DS}$, the channel is well into pinchoff, as illustrated by the intersection of the channel edge line with the insulator mid-way between source and drain. At the same $V_{DS}$ and $V_{GS}$, the channel is just barely in pinchoff with the insulation thickness illustrated in FIG. 20b. Again at the same $V_{DS}$ and $V_{GS}$, the thinnest insulator produces a relatively high field intensity and therefore a strong inversion, so the channel is resistive and therefore ac conductive, as represented by the constant channel width of FIG. 20c. Variation of $V_{DS}$ causes the location of the transition from constant-current to resistive conduction to move along the length of the distributed structure.

Figure 21A:
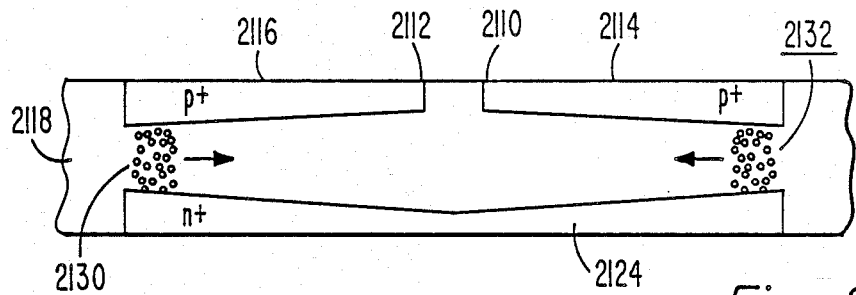
FIG. 21 illustrates by FIG. 21a an electrically positionable short-circuit arranged as a loop antenna, the size of which may be varied for tuning.
FIG. 21b is a cross-section thereof.
FIG. 21c illustrates an antenna.
Figure 21C:
Figure 21B:
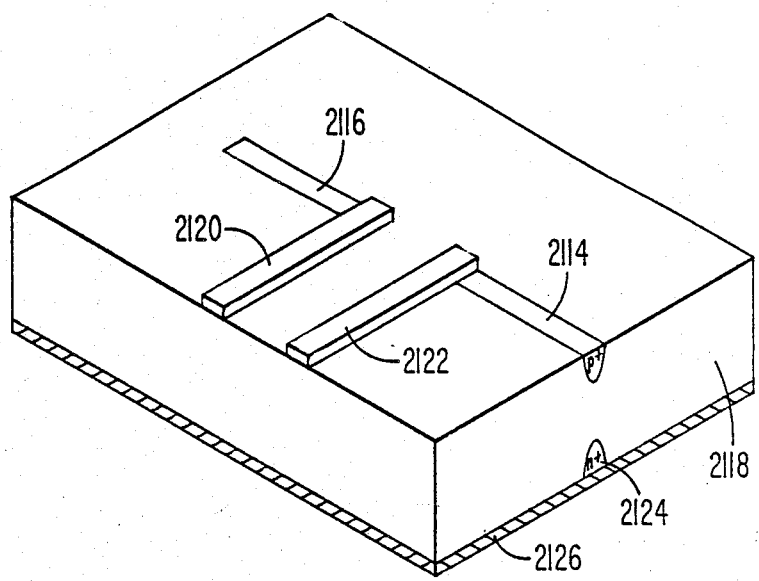

In FIG. 21, a microwave loop antenna is illustrated in cross section. The antenna feed points are points 2110, 2112, which are coupled to elongated P+ doped regions 2114, 2116, respectively, formed in an intrinsic semiconductor wafer 2118. As illustrated in the perspective view of FIG. 21b, the feed points may be coupled to a balanced two-wire transmission line consisting of elongated metallic conductors 2120, 2122. An elongated layer of N+ doped region 2124 is formed in the lower side of wafer 2118 under doped regions 2114 and 2116. A ground plane 2126 may be deposited over the bottom of wafer 2118, so as to contact N+ doped region 2124. This is a convenient way to get direct bias voltage to doped region 2124. Positive bias voltage is appled simultaneously to both conductors 2120 and 2122 relative to ground plane 2126 to forward-bias P+ regions 2114 and 2116 relative to N+ region 2124. At some voltage, conduction (dots 2130 and 2132) will occur near the ends of conductors 2114 and 2116 remote from the feed points. As the bias voltage increases, the conductive region will spread toward the feed point in the direction of the arrows. Those skilled in the art will recognize this as the equivalent of a loop antenna, such as antenna 2140 of FIG. 21c, with sides physically movable in response to the bias voltage.

Other embodiments of the invention will be apparent to those skilled in the art. For example, the frequencies of operation have been described as including 3 to 300 GHz, but the principles described are applicable at all frequencies. It is possible to make each diode of the arrangement of FIG. 1 a series combination of diodes, the forward junction voltages of which are selected to provide the desired range of control: Diode 40 could be the series combination of two germanium diodes (total forward voltage drop 0.6 volts), while diode 42 could be a single silicon diode (total voltage drop 0.7 volts), and diodes 44 the series combination of three germanium diodes (0.9 volts), and diode 46 the series combination of a silicon and germanium diode (1.0 volt).

What is claimed is:

1. An electrically-positionable short circuit for presenting a short circuit to a source of alternating current which short circuit is controllable in position in response to the magnitude of an electrical bias produced by a bias source which is independent of said alternating current source, comprising:

first and second approximately parallel conductive means;

first connection means coupled to said first and second conductive means, said first connection means being adapted for coupling said first and second conductive means to said source of alternating current;

semiconductor means physically positioned between and extending between said first and second conductive means at least frist and second pairs of distinct locations thereon, one of each pair of locations being associated with one of said first and second conductive means, and the other of each pair of locations being associated with the other of said first and second conductive means, said semiconductor means being responsive to the magnitude of said electrical bias in such a manner that at a first magnitude of said electrical bias of a given polarity, a short circuit path is established, at least for said alternating currents, between said first pair of distinct locations and a high impedance path is established, at least for said alternating currents, between said second pair of physically distinct locations, and such that, at a second magnitude, greater than said first magnitude, of said electrical bias, and of said given polarity, a short circuit path is established, at least for said alternating currents, between said second pair of distinct locations; and second connection means coupled to said semiconductor means, said second connection means being adapted for coupling said semiconductor means to said bias source for coupling said electrical bias to said semiconductor means for establishing, by the magnitude of said electrical bias of said given polarity, the impedance, at least for said alternating current, between said second pair of distnct locations.

2. A short-circuit according to claim 1 wherein said first and second conductive means comprise metallic conductor material.

3. A short-circuit according to claim 2 wherein said first and second conductive means comprise heavily doped semiconductor material.

4. A short-circuit according to claim 3 wherein said semiconductor means comprises diode.

5. A short-circuit according to claim 4 wherein said diodes comprise a zener diode.

6. A short-circuit according to claim 4 wherein said diode comprise PIN diodes.

7. A microwave circuit semiconductor arrangement comprising:
a semiconductor substrate;
an elongated first doped region;
an elongated second doped region oriented at a skew angle with said elongated first doped region, and separated therefrom;
means for applying alternating signal current to one of said first and second regions; and
bias means for establishing a region of short circuit current flow between said elongated first and second doped regions, at least one boundary of said region of short circuit current flow moving in physical position as a function of a characteristic of said bias, whereby a conduction characteristic of said alternating signal is altered in response to said bias.

8. An arrangement according to cliam 7 wherein said first doped region is a P+ region, said second doped region is an N+ region, and the region of said semiconductor substrate separating said P+ and N+ regions is an intrinsic region.

9. An arrangement according to claim 8 wherein said bias means comprises a direct voltage source.

10. An apparatus for changing the effective dimensions of an electrical signal translating circuit, comprising:
a source of alternating signal to be translated, said source including first and second poles;
first elongated conductive means coupled to said first pole of said source of alternating signal and adapted for receiving signal to be translated;
second elongated conductive means coupled to said second pole of said source of alternating signal;
semiconductor means coupled at least to distinct physical points along said first and second elongated conductive means for controllably providing a short circuit path at least for the flow of alternating signal current therebetween; and
control means coupled to said semiconductor means for applying to said semiconductor means an electrical control signal separate from said alternating signal for controlling said semiconductor means in response to the magnitude of said control signal of a particular polarity and greater than a particular magnitude, which particular magnitude renders at least a portion of said semiconductor means conductive for producing, at least for said alternating signal current, a short-circuit condition of said portion between at least one pair of said distinct physical points, and for controlling said semiconductor means in response to the magnitude of said control signal of said particular polarity having magnitudes greater than said particular magnitude for selecting additional ones of said points along said first and second elongated conductive means between which said short circuit path for the flow of said points along said first and second elongated conductive means between which said short circuit path for the flow of said alternating signal current occurs.

11. An electrically positionable short-circuit, comprising:
first and second conductive means adapted for receiving alternating current;
semiconductor means physically positioned and extending between said first and second conductive means at least first and second pairs of physically distinct locations thereon, one of each pair of locations being associated with one of said first and second conductive means, said semiconductor means having bias magnitude dependent conduction characteristics which differ as between said first and second locations, said semiconductor means being adapted to receive near both said first and second locations a controllable bias of a particular polarity and to respone to the magnitude of said bias in a manner such that, at a first magnitude of said bias, a short circuit path is established at least for said alternating current between said first pair of physically distinct locations and a high impedance path is established at least for said alternating current between said second pair of physically distinct locations, and at a second magnitude of said bias different from said first magitude and of said same particular polarity a short circuit path is established at least for said alternating current between said second pair of physically distinct locations.

12. A short-circuit according to claim 11 further comprising:

bias control means coupled to said semiconductor means for coupling said controllable bias thereto.

13. A short-circuit according to claim 12 wherein said bias control means comprises controllable voltage generating means.

14. a short-circuit according to claim 11 wherein said semiconductor means comprises a diode.

15. A short-circuit according to claim 11 wherein said semiconductor means comprises a FET.

16. A short-circuit according to claim 11 wherein said first and secnd conductors are both elongated.

17. a short-circuit according to claim 16 wherein said first and second elongated conductors are approximately paralle.

* * * * *

UNITED STATES PATENT AND TRADEMARK OFFICE
CERTIFICATE OF CORRECTION

PATENT NO. : 4,843,358

DATED : June 27, 1989

INVENTOR(S) : William Harry Meise et al.

It is certified that error appears in the above-identified patent and that said Letters Patent is hereby corrected as shown below:

Column 1, line 22, "shorti-circuits" should be --short-circuits--.

Column 1, line 49 "sue" should be --use--.

Column 2, line 31, after "presents" add the following --at least to the alternating current, a relatively--.

Column 2, line 32, after "locations" add the following --of the first and second conductors and a relatively--.

Column 2, line 33, "distanct" should be --distinct--.

Column 2, line 34 "boas" should be --bias--.

Column 2, line 55, after "FIG." add --5-- before "a;".

Column 3, line 19, "scematic" should be --schematic--.

Column 4, line 32, change "illusrtated" to --illustrated--.

Column 4, line 53, "numberal" should be --numeral--.

Column 4, line 54, "accociated" should be --associated--.

Column 8, line 17, "valus" should be --value--.

Column 8, line 34, after "portions" delete --,--.

Column 8, line 37, "dias" should be --bias--.

Column 8, line 64, "betwenne" should be --between--.

Column 10, line 8, change "havve" should be --have--.

Column 10, line 11, "idode" should be --diode--.

Column 11, line 2, "numberal" should be --numeral--.

Column 12, line 14, "numberal" should be --numeral--.

UNITED STATES PATENT AND TRADEMARK OFFICE
CERTIFICATE OF CORRECTION

PATENT NO. : 4,843,358

DATED : June 27, 1989

INVENTOR(S): William Harry Meise et al.

It is certified that error appears in the above-identified patent and that said Letters Patent is hereby corrected as shown below:

Column 12, line 51, after "FIGS. 13b," add --13c--.

Column 14, line 4, "desingated" should be --designated--.

Column 14, line 9, after "double" insert --stub--.

Column 14, line 18, "avioded" should be --avoided--.

Column 17, line 5, after "means" add --at--.

Column 17, line 5, "frist" should be --first--.

Column 17, line 31, "distnct" should be --distinct--.

Column 17, line 40, after "comprises" add --a--.

Column 17, line 42, "diodes" should be --diode--.

Column 18, line 45, after "means" add --at--.

Column 18, line 54, "respone" should be --respond--.

Column 19, line 6, "a" should be --A--.

Column 20, line 4, "secnd" should be --second--.

UNITED STATES PATENT AND TRADEMARK OFFICE
CERTIFICATE OF CORRECTION

PATENT NO. :   4,843,358

DATED       :   June 27, 1989

INVENTOR(S) :   William Harry Meise et al.

It is certified that error appears in the above-identified patent and that said Letters Patent is hereby corrected as shown below:

Column 20, line 5, "a" should be --A--.

Column 20, line 7, "paralle" should be --parallel--.

Signed and Sealed this

Seventeenth Day of July, 1990

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,843,358

DATED : June 27, 1989

INVENTOR(S) : William Harry Meise et al

It is certified that error appears in the above-identified patent and that said Letters Patent is hereby corrected as shown below:

Column 18, lines 35 to 37, delete "...points along said first and second elongated conductive means between which said short circuit path for the flow of said".

Signed and Sealed this

Seventeenth Day of March, 1992

Attest:

HARRY F. MANBECK, JR.

*Attesting Officer*      *Commissioner of Patents and Trademarks*